United States Patent
Narazaki et al.

(12)

(10) Patent No.: US 6,285,058 B1
(45) Date of Patent: Sep. 4, 2001

(54) INSULATED GATE SEMICONDUCTOR DEVICE AND METHOD OF MANUFACTURING THE SAME

(75) Inventors: Atsushi Narazaki, Fukuoka; Hidetoshi Souno, Hyogo; Yasunori Yamashita, Tokyo, all of (JP)

(73) Assignees: Mitsubishi Denki Kabushiki Kaisha, Tokyo; Ryoden Semiconductor System Engineering Corporation, Itami, both of (JP)

( * ) Notice: Subject to any disclaimer, the term of this patent is extended or adjusted under 35 U.S.C. 154(b) by 0 days.

(21) Appl. No.: 09/485,702

(22) PCT Filed: Aug. 29, 1997

(86) PCT No.: PCT/JP97/03040

§ 371 Date: Feb. 28, 2000

§ 102(e) Date: Feb. 28, 2000

(87) PCT Pub. No.: WO99/12214

PCT Pub. Date: Mar. 11, 1999

(51) Int. Cl.[7] .......................... H01L 29/76; H01L 21/336
(52) U.S. Cl. ......................... 257/330; 257/328; 257/329; 438/268; 438/270
(58) Field of Search ................................. 438/268–274, 438/206, 209, 212, 156, 173, 192; 257/328, 329, 330

(56) References Cited

U.S. PATENT DOCUMENTS 5,541,425 * 7/1996 Nishihara .

6,114,205 * 9/2000 Mori ...................................... 438/270
6,124,611 * 9/2000 Mori ...................................... 257/330

FOREIGN PATENT DOCUMENTS

| 1-292862 | 11/1989 | (JP) . |
| 4-129227 | 4/1992 | (JP) . |
| 7-131012 | 5/1995 | (JP) . |
| 7-249769 | 9/1995 | (JP) . |
| 8-23096 | 1/1996 | (JP) . |
| 9-129877 | 5/1997 | (JP) . |

* cited by examiner

Primary Examiner—John F. Niebling
Assistant Examiner—Viktor Simkovic
(74) Attorney, Agent, or Firm—Oblon, Spivak, McClelland, Maier & Neustadt, P.C.

(57) ABSTRACT

The present invention relates to an insulated gate semiconductor device and a method of manufacturing the same, and more particularly to an improvement for enhancing a gate breakdown voltage. In order to achieve the object, gate wirings (9), (10) and (13) are provided to keep away from an upper end (UE) of an edge of a gate trench (6) along its longitudinal direction. More specifically, the gate wiring (9) coupled integrally with an upper surface of a gate electrode (7) is formed apart from the upper end (UE) and the gate wiring (10) is formed on an insulating film (4) also apart from the upper end (UE). The two gate wirings (9) and (10) are connected to each other through the gate wiring (13) formed on a BPSG layer (11). Moreover, an upper face of the gate electrode (7) is positioned on the same level as an upper main surface of a semiconductor substrate (90) or therebelow in the vicinity of the upper end (UE). Consequently, a concentration of an electric field generated in insulating films (8) and (17) covering the upper end (UE) can be relieved or eliminated.

20 Claims, 36 Drawing Sheets

101 (CR)

GR

CR

GR

GR

GR

CR

GR

GR 102 (GR)

102a (GR)

103 (GR)

103a (GR)

GR

GR

GR

GR

GR

GR

GR 106 (GR)

107 (GR)

INSULATED GATE SEMICONDUCTOR DEVICE AND METHOD OF MANUFACTURING THE SAME

TECHNICAL FIELD

The present invention relates to an insulated gate semiconductor device and a method of manufacturing the same, and more particularly to an improvement for enhancing a gate breakdown voltage.

BACKGROUND ART

An insulated gate semiconductor device (which will be provisionally referred to as a "vertical device") including a gate electrode buried in a trench formed in a main surface of a semiconductor substrate, that is, a trench gate has the gate electrode formed in a vertical direction with respect to the main surface differently from an insulated gate semiconductor device (which will be provisionally referred to as a "lateral device") having a gate electrode formed opposite to the main surface of the semiconductor substrate. Therefore, an area of the main surface occupied by a unit cell can be reduced. Consequently, the number of cells per unit area, that is, a cell density can be increased by using a microfabrication technique.

As the cell density is increased, a main current flowing between a pair of main electrodes of the device when the device is in a conducting state (an ON state) is increased. An electric resistance between a pair of main electrodes which is obtained when the insulated gate semiconductor device is in the conducting state is referred to as an "ON-state resistance", and is one of important indices to evaluate the characteristic of the device. In the lateral device, when the cell density is increased to exceed a certain limit, a "j-FET resistance" which is one of components of the ON-state resistance is considerably increased. For this reason, the lateral device has a limit to increase the main current while keeping the ON-state resistance within a certain range.

On the other hand, the vertical device has an advantage that there is no limit derived from the j-FET resistance. As a typical example making the most of the advantage of the vertical device, a MOSFET (MOS field effect transistor) having a trench gate and an IGBT (Insulated Gate Bipolar Transistor) having a trench gate have widely been known.

FIG. 69 is a plan view showing a gate wiring region of a MOSFET having a trench gate according to the prior art. Moreover, FIGS. 70 and 71 are sectional views taken along cutting lines A—A and B—B in FIG. 69, respectively. In a device 150, an n-type epitaxial layer 72 is formed on an n-type substrate layer 71 including an n-type impurity having a high concentration and has a lower impurity concentration than in the n-type substrate layer 71. By these semiconductor layers, a semiconductor substrate 99 is constituted.

A p-type semiconductor layer 96 and a p well layer 73 are selectively formed in a surface of the n-type epitaxial layer 72, that is, an upper main surface of the semiconductor substrate 99. The p well layer 73 is formed to be connected to the p-type semiconductor layer 96, and furthermore, to surround a periphery of the p-type semiconductor layer 96.

A plurality of gate trenches 76 arranged in parallel with each other are formed like a band in the upper main surface of the semiconductor substrate 99. The gate trench 76 is formed more deeply than the p-type semiconductor layer 96 and more shallowly than the n-type epitaxial layer 72. In the gate wiring region shown in FIGS. 69 to 71, an edge of the gate trench 76 along its longitudinal direction is present. An internal wall of the gate trench 76 is covered with a gate insulating film 78. A gate electrode 77 made of polysilicon doped with an impurity having a high concentration is buried in the gate trench 76 through the gate insulating film 78.

In the gate wiring region, an area in the upper main surface of the semiconductor substrate 99 where a gate electrode 7 is not present is covered with an insulating film 87 or an insulating film 74. The insulating film 74 is selectively formed as a LOCOS (local oxidation of silicon) film more thickly than the insulating film 87 in a direction of an array of gate trenches 6 over the p well layer 73 while keeping a space with the gate trench 6. In the vicinity of an end of the gate trench 6 along its longitudinal direction, the gate electrode 77 is connected to a gate wiring 79.

The gate wiring 79 is formed of the same material as a material of the gate electrode 77, and furthermore, is continuously provided integrally with the gate electrode 77. Moreover, the gate wiring 79 is provided on the insulating film 74 and is extended toward the gate trench 6 to cover an edge portion of the gate electrode 77 in order to implement a connection with the gate electrode 77. The insulating film 74 is provided to keep a high breakdown voltage between the gate wiring 79 and the p well layer 73.

Furthermore, an n-type semiconductor layer 75 containing arsenic in a high concentration is selectively formed in the upper main surface of the semiconductor substrate 99. The n-type semiconductor layer 75 is formed to surround an upper end UE of an edge of the gate trench 6 along its longitudinal direction. In a process of manufacturing the device, the n-type semiconductor layer 75 is formed, and the gate trench 76 and the insulating film 87 are then formed by a thermal oxidation treatment. At this time, the oxidation is accelerated by the action of the impurity contained in the n-type semiconductor layer 75. Therefore, the gate trench 76 and the insulating film 87 which cover the vicinity of the upper end UE are completed thickly. Consequently, it is possible to obtain the effect of increasing insulation strengths of the gate electrode 77 and the insulating film 87 in the vicinity of the upper end UE.

The surfaces of the gate electrode 77 and the gate wiring 79 are covered with an insulator having a three-layer structure constituted by an insulating film 86, a BPSG layer 81 and an insulating film 89. Both of the insulating films 86 and 89 are made of oxide. A source electrode 84 and a gate wiring 83 are provided on the insulating film 89. Both the source electrode 84 and the gate wiring 83 are made of Al—Si. In the insulator having the three-layer structure, an opening 95 is selectively formed in a portion provided above the insulating film 74, and the gate wiring 79 and the gate wiring 83 are electrically connected through the opening 95. A drain electrode 85 is provided on a lower main surface of the semiconductor substrate 99, that is, a surface of the n-type substrate layer 71.

An n-type source layer is selectively formed in an area in the upper main surface of the semiconductor substrate 99 which is provided adjacently to the gate trench 76 over the cell region of the device, which is not shown. The source electrode 84 is connected to the n-type epitaxial layer 72 and the n-type source layer which are exposed to the upper main surface of the semiconductor substrate 99 in the cell region. A portion of the p-type semiconductor layer 96 which is interposed between the n-type source layer and the n-type epitaxial layer 72 and is opposed to the gate electrode 77 functions as a channel region.

When using the device, a positive voltage with reference to the source electrode 84 is applied to the drain electrode 85. By regulating a voltage to be applied to the gate electrode 77 through the gate wiring 83 and the gate wiring 79, a magnitude of the main current flowing from the drain electrode 85 to the source electrode 84 is controlled.

In order to make the drain electrode 85 and the source electrode 84 conductive, a positive gate voltage for the source electrode 84 is applied to the gate electrode 77. Since the gate electrode 77 and the gate wiring 79 are connected to each other, their electric potentials are equal to each other. Moreover, since the p well layer 73 and the source electrode 14 are connected to each other, their electric potentials are also equal to each other. For this reason, when the device is set in a conducting state, an electric field E having a magnitude of $E=V_{GS}/d$ for a gate voltage $V_{GS}$ and a thickness d of an insulating film is generated on the gate insulating film 78 and the insulating film 87 which are provided between the gate electrode 77 and gate wiring 79, and the p well layer 73.

In order to bring the device into a cut-off state, a zero or negative voltage is applied as a gate voltage. When the gate voltage is zero, the electric field E generated in the insulating film is set to E=0. In other words, the electric field in the insulating film disappears. When the gate voltage has a negative value (−VGS), the electric field E having a magnitude of $E=-VGS/d$ is generated. The insulating film should have an insulation strength to be resistant to these electric fields. In order to evaluate a reliability related to the insulation strength, a reliability test is executed in the final stage of the manufacturing process.

By taking a well-known HTGB (high temperature gate bias) test as an example, the device 150 as a test object is kept in a high-temperature state by using a thermostat or a hot plate. With this state kept and the source electrode 84 and the drain electrode 85 short-circuited through an external wiring, a gate voltage is applied between the gate electrode 77 and the source electrode 14. Both positive and negative voltages are applied as the gate voltage.

In addition, a magnitude of the gate voltage to be applied is set to approximate to an assured actual value for the device 150 in many cases. The device 150 is put under such severe conditions for a long period of time. For that period, the situation of a deterioration in the gate insulating film 78 and the insulating film 87 and a degree of a change in other characteristics are investigated. Through such tests, a portion covering the upper end UE of the gate trench 6 described above is indicated as one of weak portions of the insulating film.

The upper end UE is a portion where the semiconductor layer 75 is protruded at a right angle toward the gate electrode 77 and the gate wiring 79 as is enlarged in FIG. 72. For this reason, an electric field EF concentrates in the portion covering the upper end UE in the gate insulating film 78 and the insulating film 87. In addition, the gate insulating film 78 and the insulating film 87 are sharply bent at the upper end UE. Therefore, the film tends to have a small thickness. More specifically, the portion covering the upper end UE in the gate insulating film 78 and the insulating film 87 is a weak portion in a double sense with regard to an increase in the gate breakdown voltage (gate-source breakdown voltage) of the device.

The n-type semiconductor layer 75 is provided in order to improve the weak portion by increasing the thickness of the insulating film covering the upper end UE. In order to produce the effect of so-called "enhanced oxidation" by the arsenic contained in the n-type semiconductor layer 75, however, it is necessary to keep a time for a heat treatment to form the insulating films 78 and 87 longer than a certain extent. If the time for the heat treatment is long, portions in the gate insulating film 78 other than the upper end UE also become considerably thick. Consequently, a gate threshold voltage is dropped, and furthermore, an ON-state resistance is increased. For this reason, a device capable of producing the effect of the gate insulating film 78 is restricted to a device in which a low voltage is applied to a gate or a device in which the time for the heat treatment to form the insulating films 78 and 87 can be prolonged.

In the conventional insulated gate semiconductor device, thus, a portion having a small insulation strength is present on the insulating film related to the insulation of the gate electrode and the gate wiring. Therefore, there has been a problem in that a reliability of the insulating film is poor and is also reflected in a yield of the device as a product.

DISCLOSURE OF THE INVENTION

In order to solve the above-mentioned problems, it is an object of the present invention to provide an insulated gate semiconductor device capable of enhancing an insulation strength, that is, a gate breakdown voltage and a reliability of an insulating film related to insulation of a gate electrode and a gate wiring, thereby improving a yield of a product, and furthermore, to provide a method suitable for manufacture of the insulated gate semiconductor device.

A first aspect of the present invention is directed to an insulated gate semiconductor device comprising a semiconductor substrate defining an upper main surface and a lower main surface, the semiconductor substrate including a first semiconductor layer of a first conductivity type which is exposed to the upper main surface, a second semiconductor layer of a second conductivity type which is selectively formed in a portion of the upper main surface in the first semiconductor layer, and a third semiconductor layer of the first conductivity type which is selectively formed in a portion of the upper main surface in the second semiconductor layer and has a higher impurity concentration than an impurity concentration in the first semiconductor layer, wherein the semiconductor substrate is provided with a trench opened on the upper main surface and reaching the first semiconductor layer through the third and second semiconductor layers.

Moreover, the device further comprises an insulating film covering an internal wall of the trench and the upper main surface, a gate electrode buried in the trench through the insulating film, a first gate wiring which is selectively provided both on the gate electrode apart from an edge of the trench along its longitudinal direction and on the insulating film covering the upper main surface, is made of the same material as a material of the gate electrode and is continuously provided integrally with the gate electrode, a second gate wiring which is provided over the upper main surface through the insulating film opposite to the first gate wiring apart from the edge of the trench and is made of the same material as the material of the gate electrode, a third gate wiring for electrically connecting the first gate wiring and the second gate wiring, and a pair of main electrodes which are electrically connected to a surface of the semiconductor substrate, respectively.

The third gate wiring is provided apart from the edge of the trench, one of the pair of main electrodes is electrically connected to the second and third semiconductor layers on the upper main surface, and an upper surface of the gate electrode is positioned on the same plane with the upper main surface or therebelow in a portion which is in contact with the edge of the trench.

A second aspect of the present invention is directed to the insulated gate semiconductor device according to the first aspect of the present invention, further comprising an insulating layer covering the first and second gate wirings and having a first opening and a second opening selectively formed on the first and second gate wirings, respectively, wherein the third gate wiring includes a connecting wiring formed on the insulating layer and electrically connecting the first gate wiring and the second gate wiring through the first and second openings.

A third aspect of the present invention is directed to the insulated gate semiconductor device according to the second aspect of the present invention, wherein the trench is divided into a plurality of unit trenches arranged in parallel with each other, and the first gate wiring is provided like a band to intersect the unit trenches.

A fourth aspect of the present invention is directed to the insulated gate semiconductor device according to the third aspect of the present invention, wherein the first opening is formed like a band in a longitudinal direction of the first gate wiring.

A fifth aspect of the present invention is directed to the insulated gate semiconductor device according to the third aspect of the present invention, wherein the first opening is dispersively formed to keep away from portions above the unit trenches.

A sixth aspect of the present invention is directed to the insulated gate semiconductor device according to the third aspect of the present invention, wherein the first opening is dispersively formed by selecting portions above the unit trenches.

A seventh aspect of the present invention is directed to the insulated gate semiconductor device according to the first aspect of the present invention, wherein the third gate wiring includes a connecting wiring which is provided over the upper main surface through the insulating film, is made of the same material as materials of the first and second gate wirings, and is continuously provided integrally with the first and second gate wirings.

An eighth aspect of the present invention is directed to the insulated gate semiconductor device according to the seventh aspect of the present invention, further comprising an insulating layer covering the first and second gate wirings and having a first opening and a second opening selectively formed on the first and second gate wirings, respectively, wherein the third gate wiring further includes another connecting wiring formed on the insulating layer and electrically connecting the first gate wiring and the second gate wiring through the first and second openings.

A ninth aspect of the present invention is directed to the insulated gate semiconductor device according to the seventh aspect of the present invention, wherein the trench is divided into a plurality of unit trenches arranged in parallel with each other, the first gate wiring is provided like a band to intersect the unit trenches, and the connecting wiring is provided along a region interposed between the unit trenches in the upper main surface.

A tenth aspect of the present invention is directed to the insulated gate semiconductor device according to the first aspect of the present invention, wherein the insulating film covering the upper main surface of the semiconductor substrate is formed as a thick insulating film more thickly in a region directly under the second gate wiring than in other regions.

An eleventh aspect of the present invention is directed to the insulated gate semiconductor device according to the tenth aspect of the present invention, wherein the semiconductor substrate further includes a high concentration semiconductor layer of a first conductivity type which is selectively formed in the upper main surface to surround an upper end of the edge of the trench and has a higher impurity concentration than an impurity concentration in the first semiconductor layer, the high concentration semiconductor layer being also formed to cover a portion directly under an edge of the thick insulating film.

A twelfth aspect of the present invention is directed to the insulated gate semiconductor device according to the first aspect of the present invention, wherein the semiconductor substrate further includes a fourth semiconductor layer of the second conductivity type which is selectively formed in a portion of the upper main surface including a region directly under the second gate wiring so as to be coupled to the second semiconductor layer and to surround a periphery thereof, the fourth semiconductor layer being deeper than the second semiconductor layer and surrounding a lower end of the edge of the trench.

A thirteenth aspect of the present invention is directed to the insulated gate semiconductor device according to the first aspect of the present invention, wherein the second semiconductor layer is extended to a region directly under the second gate wiring in the upper main surface.

A fourteenth aspect of the present invention is directed to the insulated gate semiconductor device according to the first aspect of the present invention, wherein the semiconductor substrate further includes a high concentration semiconductor layer of a first conductivity type which is selectively formed in the upper main surface to surround an upper end of the edge of the trench and has a higher impurity concentration than an impurity concentration in the first semiconductor layer.

A fifteenth aspect of the present invention is directed to the insulated gate semiconductor device according to the fourteenth aspect of the present invention, wherein the high concentration semiconductor layer is also formed to cover a region directly under the first gate wiring.

A sixteenth aspect of the present invention is directed to a method of manufacturing an insulated gate semiconductor device comprising a step of preparing a semiconductor substrate defining an upper main surface and a lower main surface and including a first semiconductor layer of a first conductivity type which is exposed to the upper main surface, a step of selectively forming a second semiconductor layer of a second conductivity type in a portion of the upper main surface in the first semiconductor layer by selectively introducing an impurity of the second conductivity type into the upper main surface, a third semiconductor layer forming step of selectively forming a third semiconductor layer of the first conductivity type having a higher impurity concentration than an impurity concentration in the first semiconductor layer in a portion of the upper main surface in the second semiconductor layer by selectively introducing an impurity of the first conductivity type into the upper main surface, a trench forming step of selectively forming, in the semiconductor substrate, a trench reaching the first semiconductor layer through the third and second semiconductor layers by selectively performing etching on the upper main surface, a step of forming an insulating film covering an internal wall of the trench and the upper main surface, a step of depositing a conductive layer to cover the insulating film, a gate forming step of, by selectively removing the conductive layer, forming a gate electrode buried in the trench through the insulating film, a first gate wiring which is selectively provided both on the gate electrode apart from an edge of the trench along its longitudinal direction and on the insulating film covering the upper main surface and is continuously provided integrally with the gate electrode, and a second gate wiring provided over the upper main surface through the insulating film opposite to the first gate wiring apart from the edge of the trench, a step of depositing an insulating layer to cover the first and second gate wirings, a step of selectively forming a first opening and a second opening over the first and second gate wirings in the insulating layer, respectively, a step of forming a connecting wiring which electrically connects the first gate wiring and the second gate wiring by covering the insulating layer and filling in the first and second openings, and a main electrode forming step of forming a pair of main electrodes to be electrically connected to a surface of the semiconductor substrate, respectively.

One of the pair of main electrodes is formed to be electrically connected to the second and third semiconductor layers on the upper main surface at the main electrode forming step, and the gate electrode is formed such that an upper surface of the gate electrode is positioned on the same plane with the upper main surface or therebelow in a portion which is in contact with the edge of the trench at the gate forming step.

A seventeenth aspect of the present invention is directed to the method of manufacturing an insulated gate semiconductor device according to the sixteenth aspect of the present invention, further comprising a step of forming, on the upper main surface, a shielding film selectively opened prior to the trench forming step, and a step of selectively forming a thick insulating film which is thicker than the insulating film in a region where the shielding film is opened by performing a thermal oxidation treatment on the upper main surface, wherein the trench is formed to keep away from the thick insulating film at the trench forming step, and the second gate wiring is formed on the thick insulating film at the gate forming step.

An eighteenth aspect of the present invention is directed to the method of manufacturing an insulated gate semiconductor device according to the sixteenth aspect of the present invention, further comprising a step of selectively forming, in a portion of the upper main surface of the semiconductor substrate, a high concentration semiconductor layer of a first conductivity type which has a higher impurity concentration than an impurity concentration in the first semiconductor layer by selectively introducing an impurity of the first conductivity type into the upper main surface simultaneously with the third semiconductor forming step. An upper end of the edge of the trench is formed to be surrounded by the high concentration semiconductor layer at the trench forming step.

A nineteenth aspect of the present invention is directed to a method of manufacturing an insulated gate semiconductor device comprising a step of preparing a semiconductor substrate defining an upper main surface and a lower main surface and including a first semiconductor layer of a first conductivity type which is exposed to the upper main surface, a step of selectively forming a second semiconductor layer of a second conductivity type in a portion of the upper main surface in the first semiconductor layer by selectively introducing an impurity of the second conductivity type into the upper main surface, a third semiconductor layer forming step of selectively forming a third semiconductor layer of the first conductivity type having a higher impurity concentration than an impurity concentration in the first semiconductor layer in a portion of the upper main surface in the second semiconductor layer by selectively introducing an impurity of the first conductivity type into the upper main surface, a trench forming step of selectively forming, in the semiconductor substrate, a trench reaching the first semiconductor layer through the third and second semiconductor layers by selectively performing etching on the upper main surface, a step of forming an insulating film covering an internal wall of the trench and the upper main surface, a step of depositing a conductive layer to cover the insulating film, a gate forming step of, by selectively removing the conductive layer, forming a gate electrode buried in the trench through the insulating film, a first gate wiring which is selectively provided both on the gate electrode apart from an edge of the trench along its longitudinal direction and on the insulating film covering the upper main surface and is continuously provided integrally with the gate electrode, a second gate wiring provided over the upper main surface through the insulating film opposite to the first gate wiring apart from the edge of the trench, and a connecting wiring provided over the upper main surface through the insulating film apart from the edge of the trench and continuously provided integrally with the first and second gate wirings, and a main electrode forming step of forming a pair of main electrodes to be electrically connected to a surface of the semiconductor substrate, respectively.

One of the pair of main electrodes is formed to be electrically connected to the second and third semiconductor layers on the upper main surface at the main electrode forming step, and the gate electrode is formed such that an upper surface of the gate electrode is positioned on the same plane with the upper main surface or therebelow in a portion which is in contact with the edge of the trench at the gate forming step.

A twentieth aspect of the present invention is directed to the method of manufacturing an insulated gate semiconductor device according to the nineteenth aspect of the present invention, further comprising a step of depositing an insulating layer to cover the first and second gate wirings, a step of selectively forming a first opening and a second opening over the first and second gate wirings in the insulating layer, respectively, and a step of forming another connecting wiring which electrically connects the first gate wiring and the second gate wiring by covering the insulating layer and filling in the first and second openings.

In the device according to the first aspect, all the first to third gate wirings and the gate electrode are provided apart from the insulating film covering the upper end of the edge of the trench along its longitudinal direction. Consequently, a concentration of an electric field generated in the insulating film covering the upper end of the trench by a gate voltage applied to the gate electrode and the gate wiring can be relieved or eliminated. Thus, the gate breakdown voltage and yield of the device can be enhanced.

In the device according to the second aspect, the first and second gate wirings are connected to each other through the connecting wiring formed on the first and second gate wirings. Consequently, it is not necessary to match relative positions between the connecting wiring and the trench with high precision. Therefore, manufacture can easily be performed.

In the device according to the third aspect, the trench is divided into a plurality of unit trenches. Therefore, a density of a main current can be increased. Moreover, the first gate wiring is provided like a band to intersect the unit trenches, and therefore, alignment of the first gate wiring in a direction of an array of the unit trenches does not require high precision. Therefore, the manufacture can easily be performed.

In the device according to the fourth aspect, the first opening is formed like a band in a longitudinal direction of the band-shaped first gate wiring, and therefore, high precision is not required for the position of the first opening. Therefore, the manufacture can easily be performed.

In the device according to the fifth aspect, the first opening is dispersively formed. Therefore, when the first opening is formed, the influence on the insulating film positioned directly under the first gate wiring can be comparatively reduced. Consequently, a comparatively high reliability can be obtained for the portion of the insulating film positioned directly under the first gate wiring. Moreover, a comparatively large flat portion on the upper surface of the insulating layer is selected to form the first opening by keeping away from the portions above the unit trenches. Accordingly, the first opening can be formed comparatively easily.

In the device according to the sixth aspect, the first opening is formed by selecting the portions above the unit trenches. Therefore, when the first opening is formed, the insulating film positioned directly under the first gate wiring is not affected. Consequently, a high reliability can be obtained for the portion of the insulating film positioned directly under the first gate wiring.

In the device according to the seventh aspect, the first and second gate wirings are connected to each other through the connecting wiring which is made of the same material as the materials of the first and second gate wirings and is continuously provided integrally with the first and second gate wirings. Therefore, an electric resistance between the first and second gate wirings can be reduced. Consequently, a switching speed of the device can be increased.

In the device according to the eighth aspect, the first and second gate wirings are further connected to each other through another connecting wiring. Therefore, the electric resistance between the first and second gate wirings can further be reduced. Consequently, the switching speed of the device can be increased still more.

In the device according to the ninth aspect, the trench is divided into a plurality of unit trenches. Therefore, the density of the main current can be increased. Moreover, the connecting wiring is provided along a region interposed between the unit trenches in the upper main surface, that is, a region close to the gate electrode. Therefore, an electric resistance between the gate electrode and the second gate wiring can be reduced.

In the device according to the tenth aspect, the thick insulating film is inserted between the second gate wiring and the semiconductor substrate. Therefore, an insulation strength between the second gate wiring and the semiconductor substrate can be kept high.

In the device according to the eleventh aspect, the upper end of the edge of the trench is surrounded by the high concentration semiconductor layer. Therefore, the insulating film covering the upper end is formed thickly. Moreover, the high concentration semiconductor layer is also formed directly under the edge of the thick insulating film which is a weak portion of the insulating film. Therefore, the weak portion is reinforced. As a result, the reliability of the insulating film can be enhanced.

In the device according to the twelfth aspect, the fourth semiconductor layer is formed to surround the periphery of the second semiconductor layer and the lower end of the edge of the trench. Therefore, the breakdown voltage of the device can be enhanced.

In the device according to the thirteenth aspect, the second semiconductor layer is extended to the region directly under the second gate wiring. Therefore, it is possible to obtain a comparatively high breakdown voltage without providing the fourth semiconductor layer separately.

In the device according to the fourteenth aspect, the upper end of the edge of the trench is surrounded by the high concentration semiconductor layer. Therefore, the insulating film covering the upper end is formed thickly. Consequently, the reliability of the insulating film can be enhanced.

In the device according to the fifteenth aspect, the high concentration semiconductor layer is also formed to cover the region directly under the first gate wiring. Therefore, it is possible to compensate for a deterioration in the insulating layer provided directly under the first gate wiring which is caused when forming the opening of the insulating layer over the first gate wiring. In other words, the reliability of the insulating layer can be enhanced.

In the manufacturing method according to the sixteenth aspect, a device capable of relieving or eliminating the concentration of the electric field generated on the insulating film covering the upper end of the trench can easily be manufactured by a combination of conventionally well-known techniques. In addition, the first and second gate wirings are connected to each other through the connecting wiring formed on the first and second gate wirings. Therefore, it is not necessary to match relative positions between the connecting wiring and the trench with high precision. Consequently, the manufacture can particularly be performed easily.

In the manufacturing method according to the seventeenth aspect, it is possible to easily manufacture a device having a high insulation strength between the second gate wiring and the semiconductor substrate.

In the manufacturing method according to the eighteenth aspect, it is possible to easily manufacture a device having a high reliability of the insulating film.

In the manufacturing method according to the nineteenth aspect, the concentration of the electric field generated in the insulating film covering the upper end of the trench can be relieved or eliminated. In addition, it is possible to easily manufacture a device having a high switching speed by the combination of the conventionally well-known techniques.

In the manufacturing method according to the twentieth aspect, it is possible to easily manufacture a device having a higher switching speed.

The objects, features, aspects and advantages of the present invention will become more apparent from the following detailed description and the accompanying drawings.

BEST MODE FOR CARRYING OUT THE INVENTION

<1. First Embodiment>

First of all, a semiconductor device according to a first embodiment will be described below.

<1-1. Structure and Operation of Device>

Figure 2:
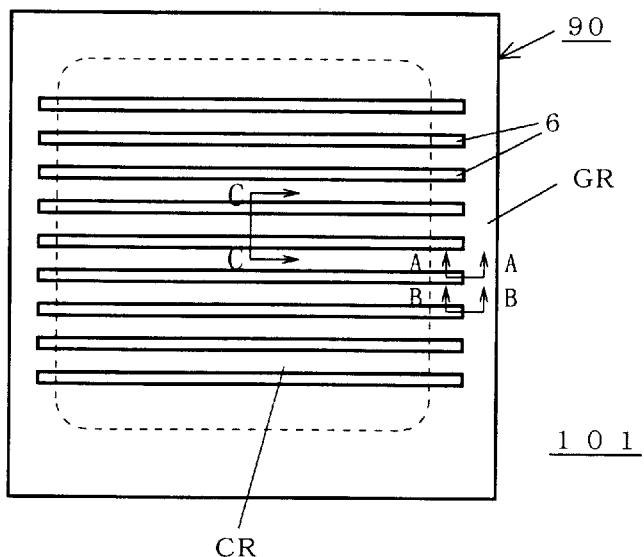
FIG. 2 is a sectional plan view showing the device according to the first embodiment.

FIG. 2 is a sectional plan view showing an upper main surface of a semiconductor substrate provided in the semiconductor device according to the first embodiment. A device 101 is constituted as a trench type MOSFET having a large number of unit cells. A semiconductor substrate 90 is in the shape of a plate having an upper main surface and a lower main surface, and has a large number of gate trenches (trenches) 6 formed like stripes such that they are arranged in parallel with each other along the upper main surface. One gate trench 6 is formed for each unit cell.

A central portion (a region enclosed by a dotted line in FIG. 2) of the semiconductor substrate 90 in which the unit cells are arranged will be referred to as a "cell region CR". A gate wiring which is not shown is provided around the cell region CR. The region where the gate wiring is provided will be referred to as a "gate wiring region GR". A sectional plan view shown in FIG. 2 is common to devices according to all embodiments which will be described below as well as the device 101 according to the first embodiment.

Figure 1:
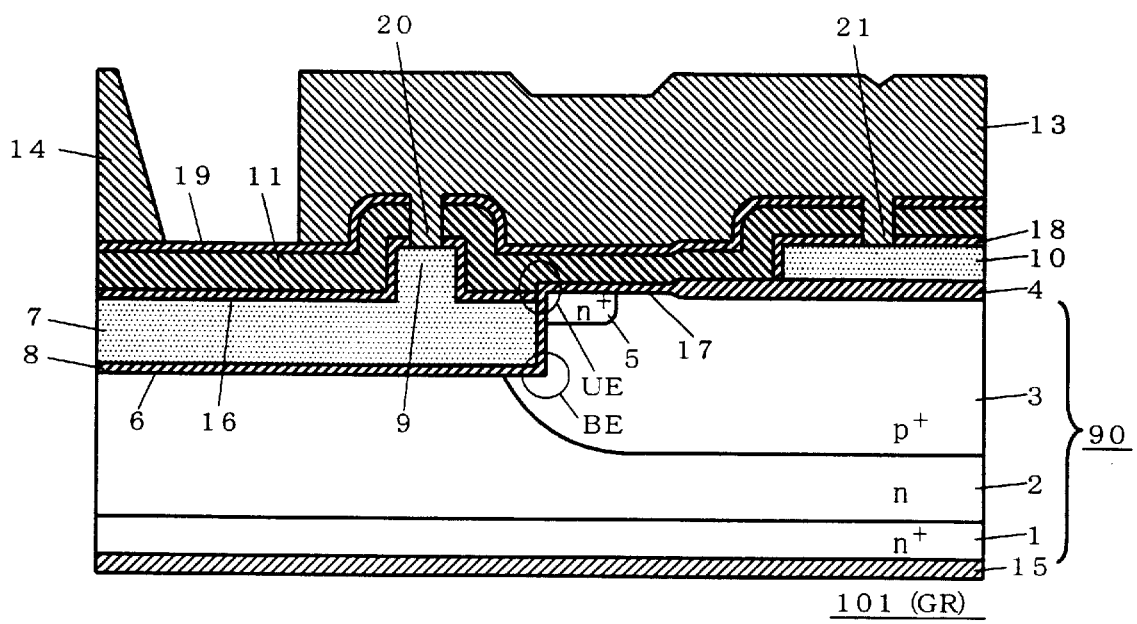
FIG. 1 is a sectional front view showing a device according to a first embodiment.
Figure 3:
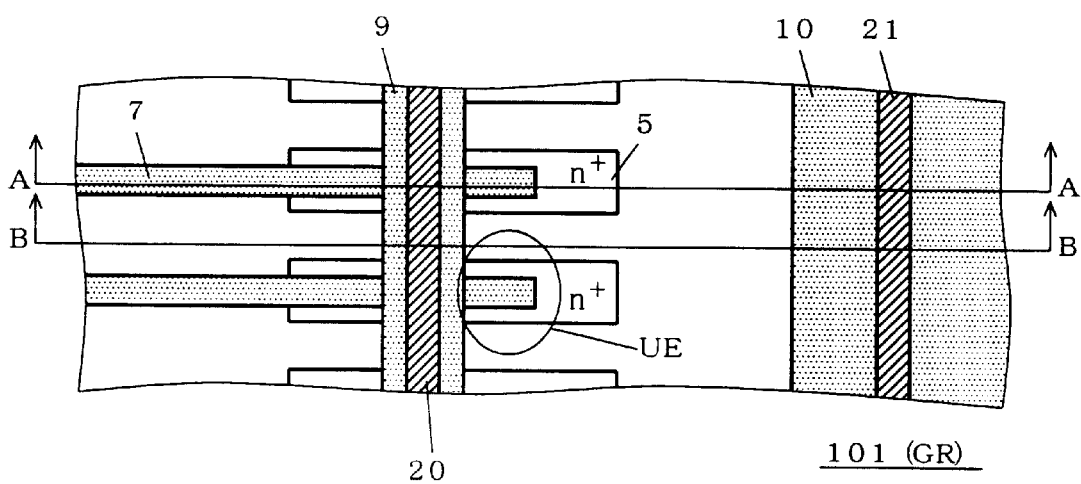
FIG. 3 is a plan view showing the device according to the first embodiment.
Figure 4:
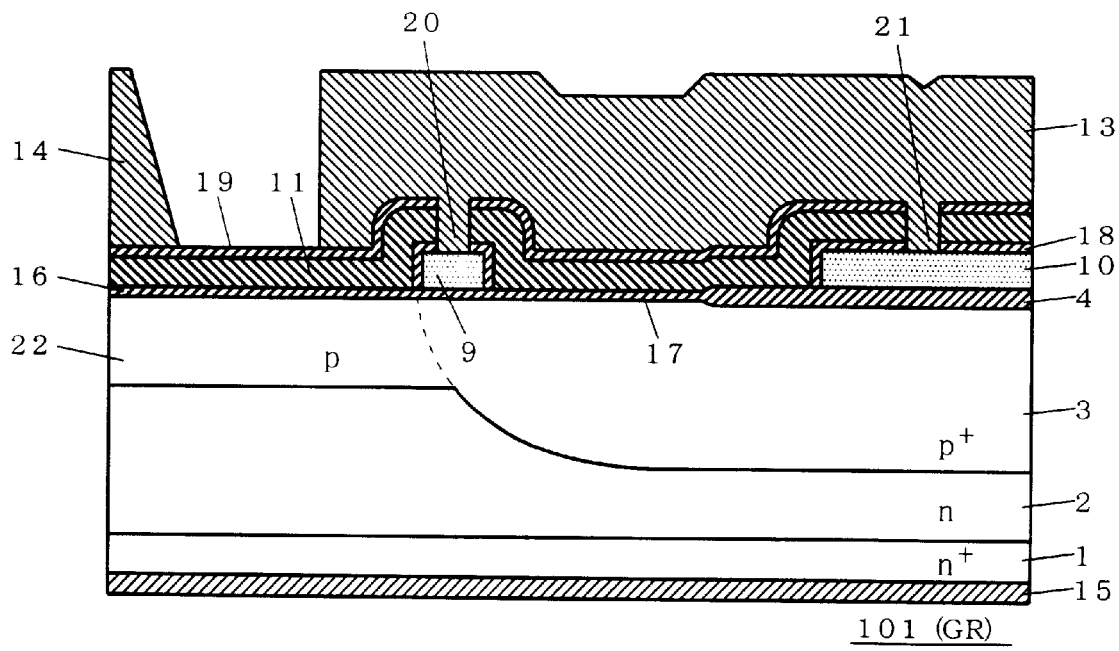
FIG. 4 is a sectional front view showing the device according to the first embodiment.
Figure 5:
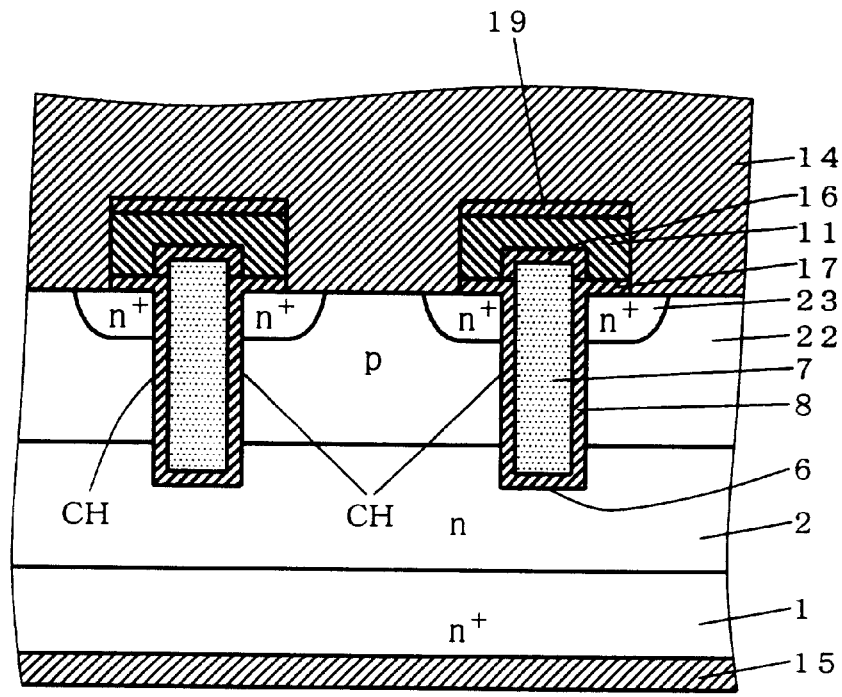
FIG. 5 is a sectional side view showing the device according to the first embodiment.

FIG. 3 is a plan view showing the device 101 in the gate wiring region GR. Moreover, FIG. 1 is a sectional view taken along a cutting line A—A shown in FIGS. 2 and 3, and FIG. 4 is a sectional view taken along a cutting line B—B. Furthermore, FIG. 5 is a sectional view taken along a cutting line C—C in FIG. 2. More specifically, FIGS. 1, 3 and 4 show a structure of the device 101 in the gate wiring region GR, and FIG. 5 shows a structure in the cell region CR. The structure and operation of the device 101 will be described below with reference to these drawings.

The semiconductor substrate 90 containing silicon as a base material is provided with a plate-shaped n-type substrate layer 1 exposed to the lower main surface and a plate-shaped n-type epitaxial layer 2 formed on the n-type substrate layer 1. A p-type semiconductor layer 22 and a p well layer 3 are selectively formed in the upper main surface of the semiconductor substrate 90, that is, a surface of the n-type epitaxial layer 2, respectively. The n-type substrate layer 1 contains an n-type impurity in a high concentration. An impurity concentration in the n-type epitaxial layer 2 is set lower than in the n-type substrate layer 1.

The p-type semiconductor layer 22 is formed over the whole cell region CR. The p well layer 3 is formed to surround the p-type semiconductor layer 22 and to include a side edge of the p-type semiconductor layer 22 in the gate wiring region GR. Both the p-type semiconductor layer 22 and the p well layer 3 are shallower than the n-type epitaxial layer 2 such that their bottoms do not reach the n-type substrate layer 1.

The gate trench 6 opened on the upper main surface of the semiconductor substrate 90 is formed more deeply than the p-type semiconductor layer 22 and more shallowly than the n-type epitaxial layer 2. The p well layer 3 in the gate wiring region GR is formed in order to raise a breakdown voltage of the device. For this purpose, the p well layer 3 is formed such that it is not shallower than the p-type semiconductor layer 22 in order to include the side edge of the p-type semiconductor layer 22.

In order to further enhance the breakdown voltage, it is desirable that the p well layer 3 should be deeper than the p-type semiconductor layer 22 as shown in FIG. 4 and should be formed to include a lower end BE of an edge of the gate trench 6 along its longitudinal direction as shown in FIG. 1. In the gate wiring region GR, moreover, an n type semiconductor layer 5 is selectively formed in the upper main surface of the semiconductor substrate 90 so as to surround an upper end UE of the edge of the gate trench 6 along its longitudinal direction. The n-type semiconductor layer 5 contains an n-type impurity in a higher concentration than an impurity concentration in the n-type epitaxial layer 2.

In the cell region CR, an n-type semiconductor layer 23 is selectively formed in the upper main surface of the semiconductor substrate 90, that is, a surface of the p-type semiconductor layer 22 adjacently to the gate trench 6. More specifically, in the cell region CR, the n-type semiconductor layer 23 and the p-type semiconductor layer 22 are selectively exposed in a region interposed between the gate trenches 6 on the upper main surface of the semiconductor substrate 90. The n-type semiconductor layer 23 contains the n-type impurity in a higher concentration than the n-type epitaxial layer 2. Moreover, the n-type semiconductor layer 23 is formed more shallowly than the p-type semiconductor layer 22.

A gate insulating film 8 made of silicon oxide is formed on an internal wall of the gate trench 6. A gate electrode 7 is buried in the gate trench 6 through the gate insulating film 8. The gate electrode 7 is made of polysilicon doped with an impurity in a high concentration. An upper surface of the gate electrode 7 and a surface (FIG. 5) of a portion of the gate electrode 7 which is protruded from the gate trench 6 are covered with an insulating film 16 made of silicon oxide.

Furthermore, the upper main surface of the semiconductor substrate 90 excluding the gate trench 6 is also covered with an insulating film 17 made of the silicon oxide. A part of the upper main surface in the gate wiring region GR is covered with an insulating film 4 formed as a LOCOS oxide film more thickly than the insulating film 17 in place of the insulating film 17. As shown in FIG. 5, moreover, an opening is selectively formed in the insulating film 17 in the cell region CR, and a source electrode 14 is connected to both the p-type semiconductor layer 22 and the n-type semiconductor layer 23 through the opening.

A drain electrode 15 is formed on an exposed surface of the n-type substrate layer 1, that is, the lower main surface of the semiconductor substrate 90. A drain current (a main current) flows through the source electrode 14 and the drain electrode 15. More specifically, the source electrode 14 and the drain electrode 15 function as a pair of main electrodes. The source electrode 14 is formed of Al—Si, for example and the drain electrode 15 is formed of a Ti/Ni/Au alloy, for example.

As shown in FIG. 5, a portion of the p-type semiconductor layer 22 which is interposed between the n-type semiconductor layer 23 and the n-type epitaxial layer 2 opposite to the gate electrode 7 through the gate insulating film 8 functions as a channel region CH. By a voltage applied to the gate electrode 7, a magnitude of the main current is controlled. In other words, the device 101 is constituted as an n channel type MOSFET.

Two kinds of gate wirings 9 and 10 are provided in the gate wiring region GR. These gate wirings 9 and 10 are formed of the same material as a material of the gate electrode 7. The gate wiring 9 is provided across an upper surface of the gate electrodes 7 in the vicinity of the edges of a string of the gate trenches 6 along their longitudinal direction and the upper main surface of the semiconductor substrate 90 in a direction of an array of the gate trenches 6. In addition, the gate wiring 9 is coupled integrally with the string of the gate electrodes 7. Moreover, the gate wiring 9 is preferably formed like a band to be orthogonal to the string of the gate electrodes 7 as shown in FIG. 3.

Figure 6:
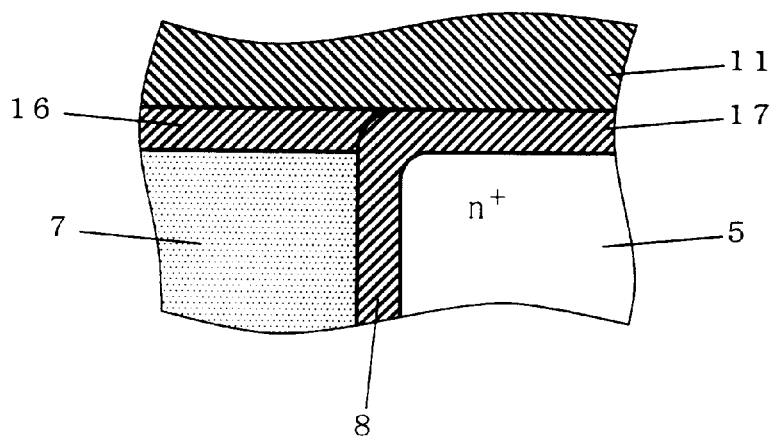
FIG. 6 is an enlarged sectional front view showing the device according to the first embodiment.

As shown in FIG. 1, the gate wiring 9 is provided in a position which somewhat retreats from the edge so as not to cover the upper ends UE of the edges of the string of the gate trenches 6 along their longitudinal direction. As shown in FIG. 6 illustrating the enlarged vicinity of the upper end UE, furthermore, the position of the upper surface of the gate electrode 7 is set on the same plane with the upper main surface of the semiconductor substrate 90 or lower than it in at least the vicinity of the edge of the gate trench 6 along its longitudinal direction, and preferably, is set lower as shown in FIG. 1. By setting the position of the upper surface of the gate electrode 7 lower, the influence of manufacturing errors can also be eliminated. As shown in FIG. 1, moreover, the upper end UE is surrounded by the above-mentioned n-type semiconductor layer 5.

The insulating film 17 is provided between the upper main surface of the semiconductor substrate 90 and the gate wiring 9, and the two are electrically insulated by the insulating film 17. In a region extending from the edge of the gate trench 6 along the longitudinal direction, an insulating film 4 is formed on the exposed surface of the p well layer 3. A gate wiring 10 is provided on the insulating film 4 in a direction of the array of the gate electrodes 7. The gate wiring 10 and the p well layer 3 are electrically insulated by the insulating film 4. Moreover, surfaces of the gate wirings 9 and 10, that is, side walls and upper surfaces thereof are also covered with the insulating film 18 made of a silicon oxide film in the same manner as the insulating film 16 covering the upper face of the gate electrode 7.

A BPSG (silicate glass containing boron and phosphorus) layer 11 is formed on the insulating films 17, 4, 16 and 18 covering the surfaces of the semiconductor substrate 90, the gate electrode 7, and the gate wirings 9 and 10. An upper surface of the BPSG layer 11 is covered with an insulating film 19 formed of a silicon oxide film. An opening is selectively formed on a multilayered insulator constituted by the insulating film 18, the BPSG layer 11 and the insulating film 19 in a connecting portion of the source electrode 14 and the semiconductor substrate 90. Consequently, a connection between the source electrode 14 and the semiconductor substrate 90 is implemented.

The above-mentioned multilayered insulator is further provided with an opening 20 formed like a band along the upper surface of the gate wiring 9 and an opening 21 formed like a band along the upper surface of the gate wiring 10. A gate wiring 13 is formed on the multilayered insulator to fill in both of the openings 20 and 21 and to connect them to each other. In other words, the gate wiring 13 electrically connects the gate wiring 9 and the gate wiring 10 to each other through the openings 20 and 21. The gate wiring 13 is formed of the same material as a material of the source electrode 14 differently from the gate wirings 9 and 10. Moreover, the gate wiring 13 and the source electrode 14 are electrically insulated from each other.

In order to use the device 101, first of all, an external power source which is not shown is connected. Consequently, a positive voltage is applied to the drain electrode 15 with reference to the source electrode 14. Usually, a load which is not shown is inserted between the external power source and the drain electrode 15, for example. In this state, a magnitude of the main current is controlled by regulating a voltage to be applied to the gate electrode 7 through the gate wirings 9, 10 and 13.

With reference to the source electrode 14, a positive gate voltage which exceeds a predetermined gate threshold voltage is applied to the gate electrode 7 (a gate is turned ON), whereby an n-type inversion layer is formed in a p-type channel region CH. As a result, the channel region CH is brought into a conducting state. Therefore, the main current flows from the drain electrode 15 to the source electrode 14. In other words, the device 101 is brought into the conducting state.

Next, when the gate voltage to be applied between the source electrode 14 and the gate electrode 7 is returned to zero or a negative (reverse bias) value (the gate is turned OFF), the inversion layer formed in the channel region CH disappears and the channel region CH returns to an original p conductivity type. As a result, the main current does not flow between the source electrode 14 and the drain electrode 15. In other words, the device 101 is brought into a cut-off state (an OFF state).

In the device 101, the upper end UE of the gate trench 6 is covered with neither the gate electrode 7 nor the gate wiring 9. The upper surface of the gate electrode 7 is not positioned higher than the upper main surface of the semiconductor substrate 90 in the upper end UE, and the gate wiring 9 is provided apart from the upper end UE. A connection between the gate wiring 9 and the gate wiring 10 is implemented by the gate wiring 13 provided on the multilayered insulator including the BPSG layer 11. In other words, the gate wiring is provided to keep away from the upper end UE differently from the conventional device 150.

As a result, a concentration of an electric field generated in the gate insulating film 8 and the insulating film 17 at the upper end UE due to the gate voltage to be applied to the gate electrode 7 and the gate wirings 9, 10 and 13 can be relieved or eliminated. Consequently, a gate breakdown voltage of the device 101 and a yield of a product can be enhanced.

Since the upper end UE is surrounded by the n-type semiconductor layer 5, the gate insulating film 8 and the insulating film 17 at the upper end UE are formed thickly. Furthermore, the insulating film 4 which is formed more thickly than the insulating film 17 is inserted between the gate wiring 10 and the p well layer 3. Therefore, a sufficiently high insulation strength can be obtained between the gate wiring 10 and the p well layer 3. These also contribute to an enhancement in the breakdown voltage and reliability of the device.

Figure 7:
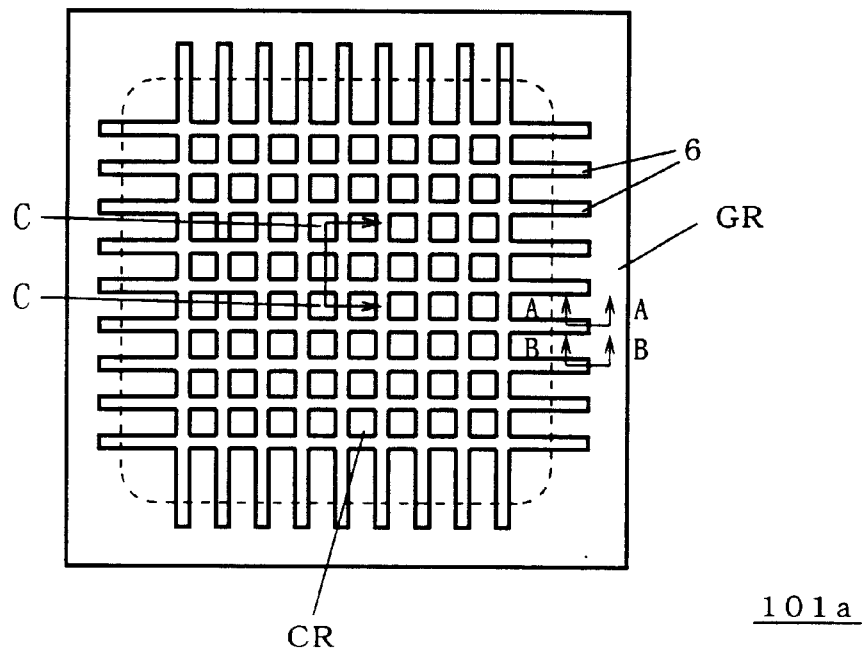
FIG. 7 is a sectional plan view showing another example of the device according to the first embodiment.

While FIG. 2 shows the example in which the string of the gate trenches 6 is arranged like bands (stripes) parallel with each other, it is sufficient that the structure of the gate wiring region GR has a configuration shown in each of FIGS. 1 to 4 and FIG. 6 and the structure of the cell region CR has a configuration shown in FIG. 5. As shown in FIG. 7, for example, the gate trenches 6 may be arranged like a grid (cross stripes). Also in a device 101a, sectional structures taken along cutting lines A—A, B—B and C—C in FIG. 7 are the same as the structures shown in FIGS. 1 to 6.

<1-2. Method for Manufacturing Device>

Figure 8:
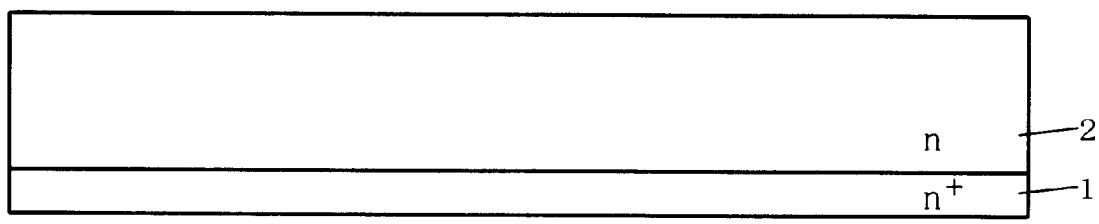
FIGS. 8 to 36 are views showing a process of manufacturing the device according to the first embodiment.

FIGS. 8 to 37 are views showing a manufacturing process of a preferable method for manufacturing the device 101. In order to manufacture the device 101, a step shown in FIG. 8 is first executed. At the step shown in FIG. 8, first of all, a semiconductor substrate containing silicon as a base material and an n-type impurity in a high concentration is prepared. The semiconductor substrate is equivalent to the above-mentioned n-type substrate layer 1. Next, an n-type epitaxial layer 2 is formed on an upper main surface of the n-type substrate layer 1 by using an epitaxial growth method. As a result, a plate-shaped semiconductor substrate 90 containing the silicon as the base material is completed.

At a step shown in FIG. 9, subsequently, a thermal oxide film 32 is first formed on the whole upper main surface of the semiconductor substrate 90. Next, a portion in the thermal oxide film 32 which corresponds to the p well layer 3 is selectively removed. Furthermore, a new thermal oxide film 31 is formed more thinly than the thermal oxide film 32 in the removed region. The selective removal of the thermal oxide film 32 is executed by selective etching using, as a shield, a resist pattern formed by utilizing photolithography. This technique has conventionally be well-known.

Subsequently, boron is implanted into a surface of the n-type epitaxial layer 2, that is, the upper main surface of the semiconductor substrate 90 by using the patterned thermal oxide film 32 as the shield. Then, the boron is diffused by a thermal treatment. As a result, a p well layer 3 is selectively formed on an upper main surface of the n-type epitaxial layer 2. It is obvious that the diffusing step is executed incidentally to the implanting step, which will be omitted in the following description.

Figure 10:
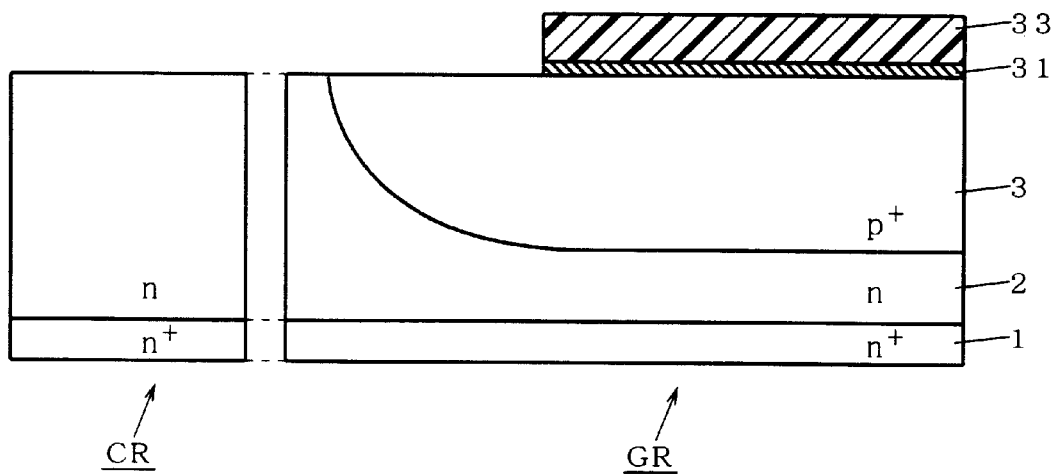

At a step shown in FIG. 10, first of all, a resist layer is deposited on the thermal oxide films 31 and 32. Then, a region of the resist layer which corresponds to the p-type semiconductor layer 22 is selectively removed, thereby forming a resist pattern 33. Next, etching is performed by using the resist pattern 33 as a shield. Consequently, the thermal oxide films 31 and 32 are selectively removed.

Figure 11:
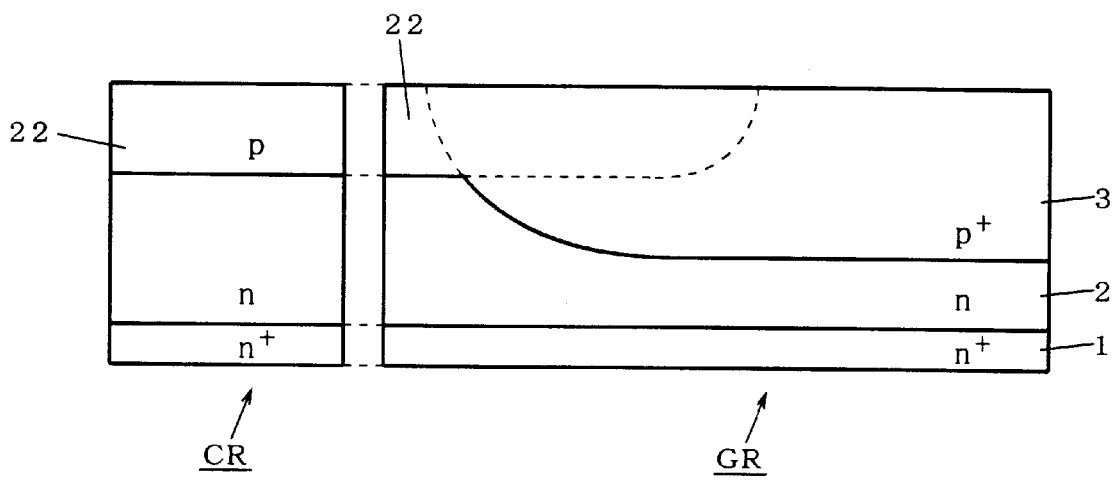

At a step shown in FIG. 11, first of all, boron is implanted into the upper main surface of the semiconductor substrate 90, that is, a surface of the n-type epitaxial layer 2. As a result, the p-type semiconductor layer 22 is formed on the surface of the n-type epitaxial layer 2 to be connected to the p well layer 3. Then, the resist pattern 33 is removed. Thereafter, the remaining thermal oxide film 31 is removed.

Figure 12:
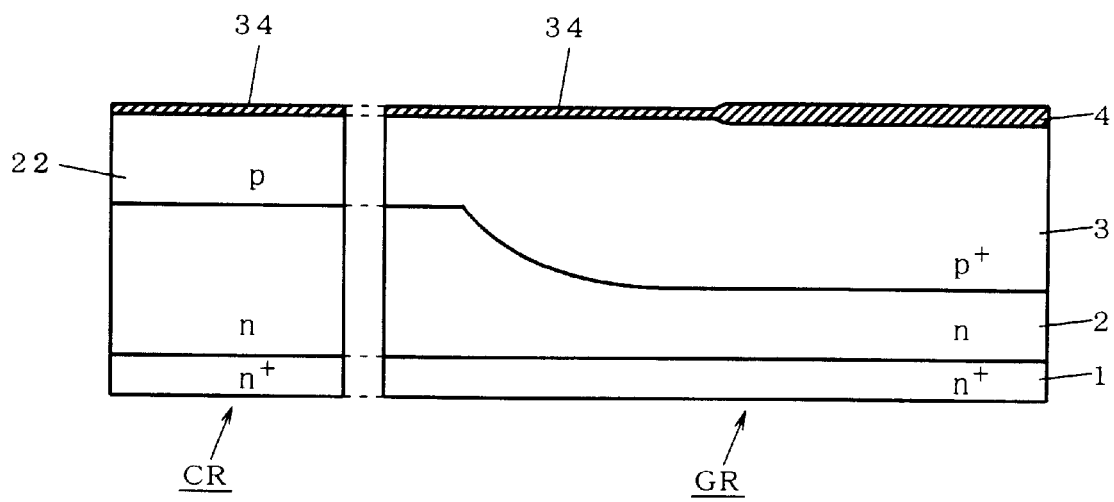

At a step shown in FIG. 12, first of all, a nitride film is formed on the whole upper main surface of the semiconductor substrate 90. Then, the nitride film is selectively removed in a region where an insulating film 4 is to be formed. As a result, a patterned nitride film 34 is formed. By executing a thermal oxidation treatment using the nitride film 34 as a shield, an insulating film 4 is selectively formed on an opening of the nitride film 34.

Figure 13:
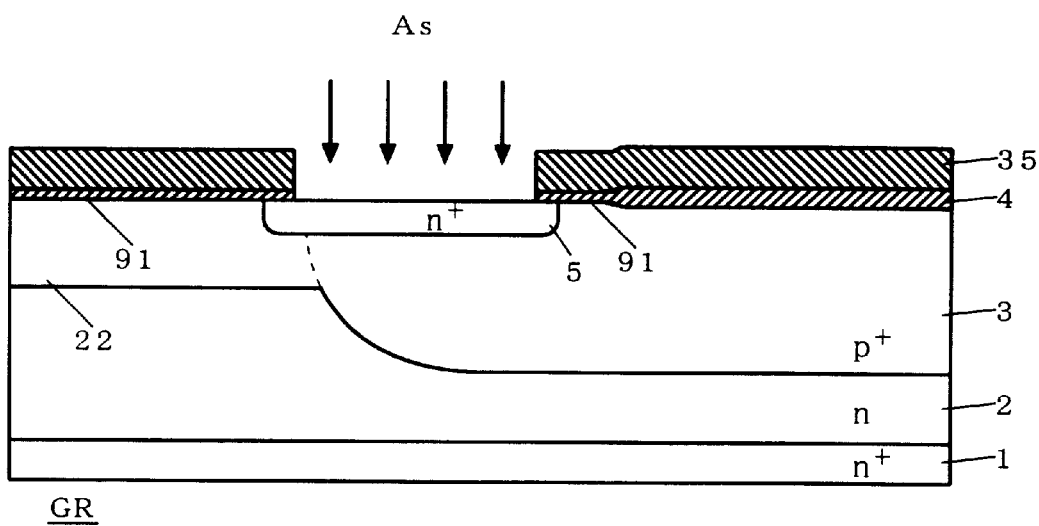
Figure 14:
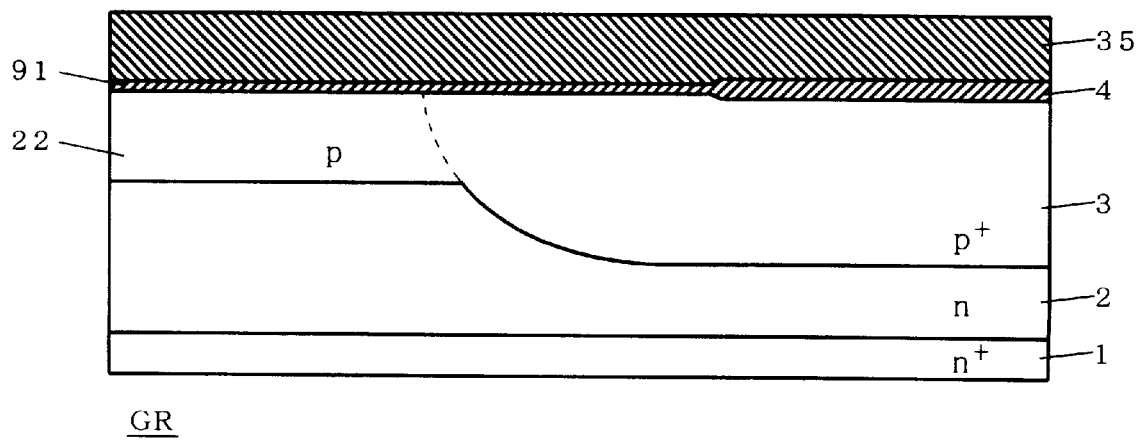
Figure 15:
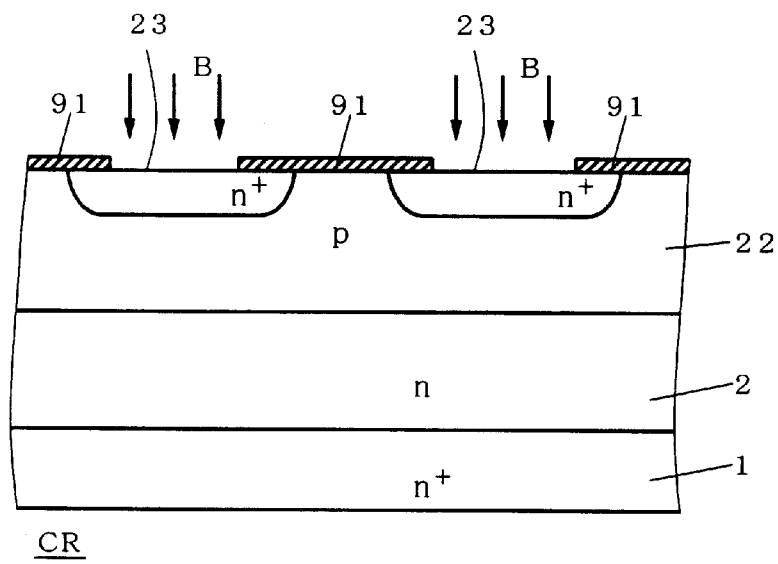

Subsequently, a step shown in FIGS. 13, 14 and 15 are executed. FIG. 13 is a sectional view taken along a cutting line A—A of the gate wiring region GR, and FIG. 14 is a sectional view taken along a cutting line B—B of the gate wiring region GR. Moreover, FIG. 15 is a sectional view taken along a cutting line C—C of the cell region CR.

At this step, first of all, the nitride film 34 is removed and a thermal oxide film 91 is then formed. As a result, the upper main surface of the semiconductor substrate 90 is covered with the insulating film 4 and the thermal oxide film 91. Next, a resist layer is deposited on upper surfaces of the insulating film 4 and the thermal oxide film 91, and an opening is then formed in portions corresponding to an n-type semiconductor layer 23 and an n-type semiconductor layer 5. Then, a wet etching treatment is executed using a patterned resist layer 35 as a shield, thereby selectively removing the thermal oxide film 91.

Subsequently, arsenic is selectively implanted into the upper main surface of the semiconductor substrate 90 using the insulating film 4 and the patterned thermal oxide film 91 as shields. As a result, the n-type semiconductor layers 23 and 5 are selectively formed on the upper main surface of the semiconductor substrate 90. Then, the thermal oxide film 91 is removed.

Figure 16:
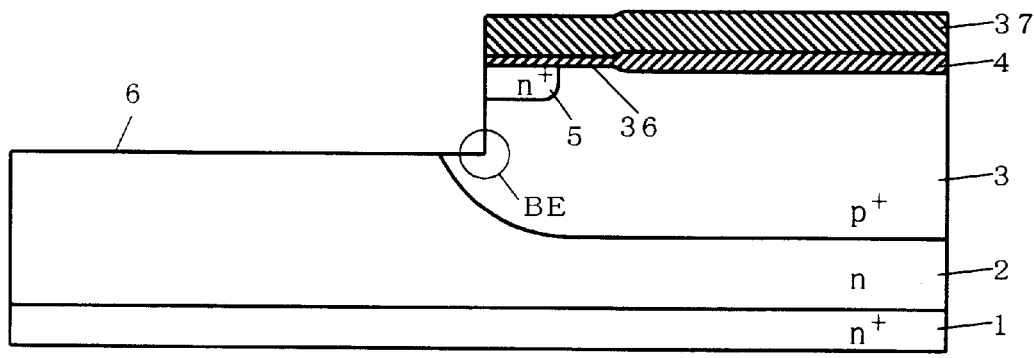
Figure 17:
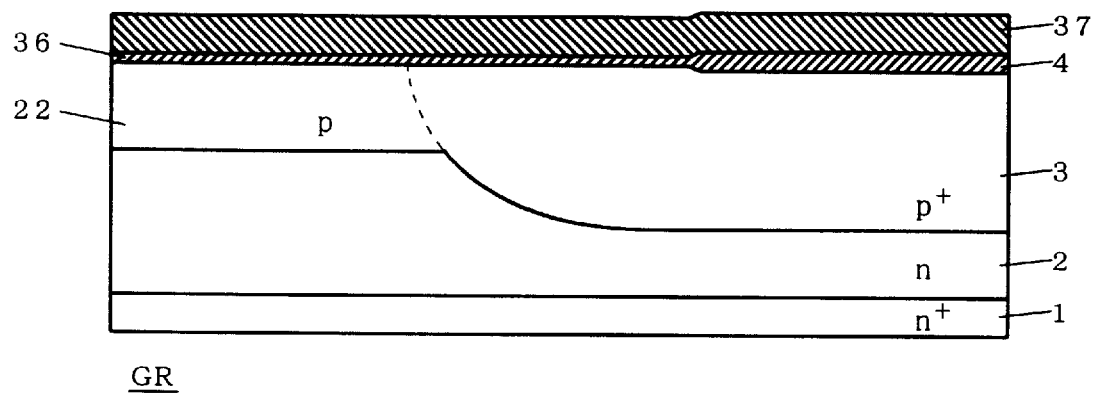
Figure 18:
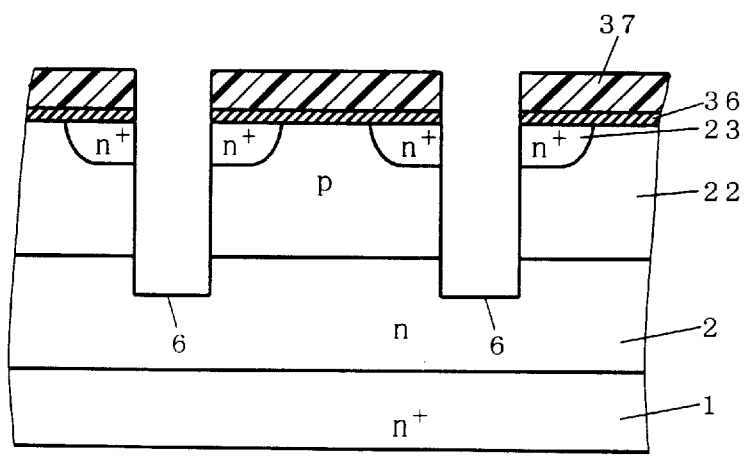

At a step of FIG. 16 (A—A section), FIG. 17 (B—B section) and FIG. 18 (C—C section), for example, a thermal oxide film 36 and a HTO layer 37 are formed on an upper surface of the intermediate product. Next, an opening is selectively formed in portions of the thermal oxide film 36 and the HTO layer 37 which correspond to the gate trench 6. A MAG-RIE method is executed using the patterned thermal oxide film 36 and HTO layer 37 as shields, thereby forming a gate trench 6 opened on the upper main surface of the semiconductor substrate 90.

The gate trench 6 is formed to penetrate the n-type semiconductor layer 23 and the n-type semiconductor layer 5. Accordingly, the n-type semiconductor layer 23 and the n-type semiconductor layer 5 are adjacent to a side wall of the gate trench 6. Then, the thermal oxide film 36 and the HTO layer 37 are removed.

Figure 19:
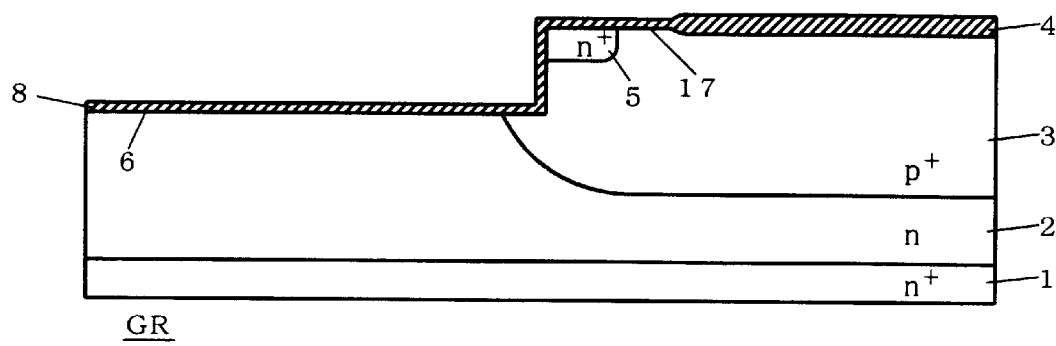
Figure 20:
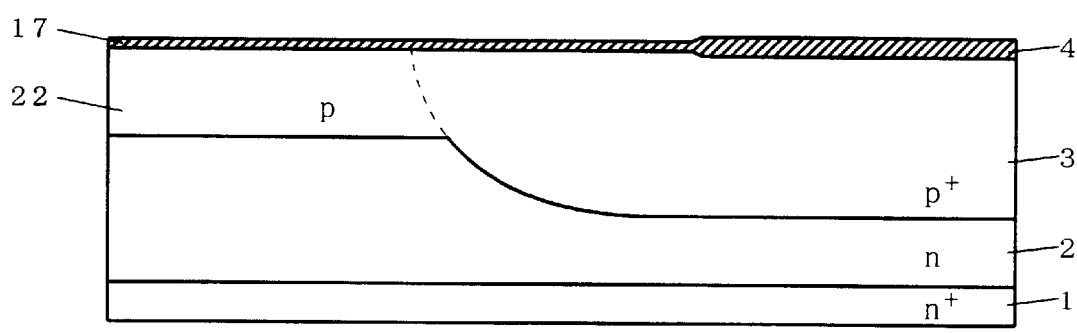
Figure 21:
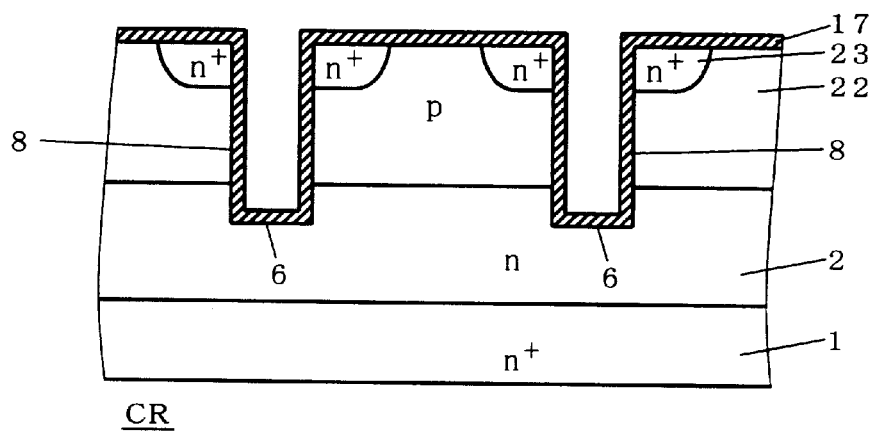

At a step of FIG. 19 (A—A section), FIG. 20 (B—B section) and FIG. 21 (C—C section), a thermal oxidation treatment is executed, thereby forming a thermal oxide film on an internal wall of the gate trench 6 and the upper main surface of the semiconductor substrate 90. More specifically, a gate insulating film 8 covering the gate trench 6 and an insulating film 17 covering the upper main surface of the semiconductor substrate 90 are formed.

Figure 22:
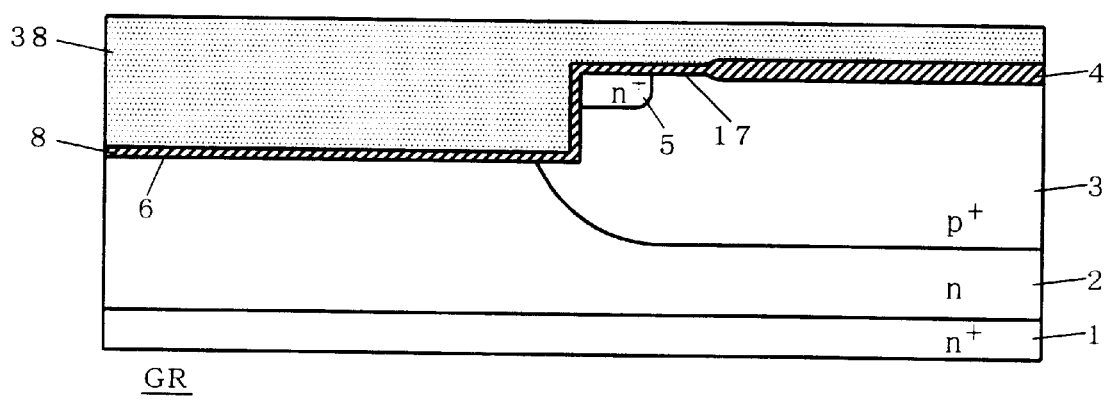
Figure 23:
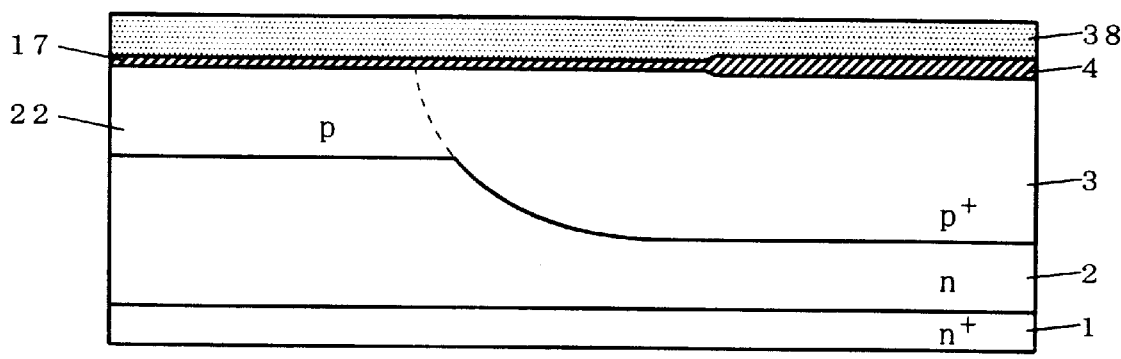
Figure 24:
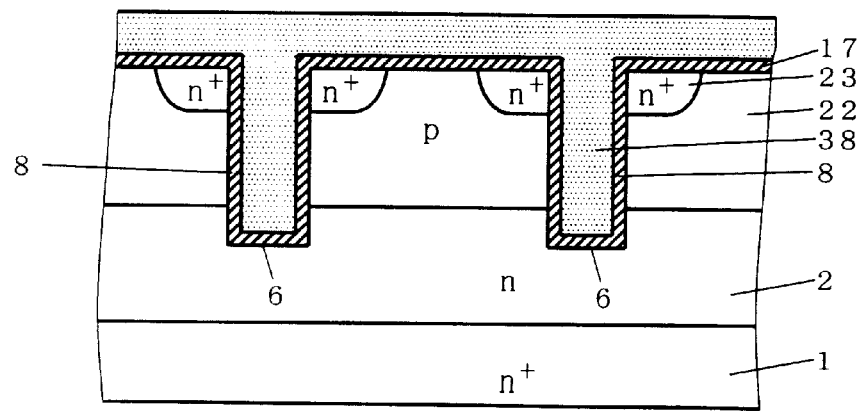

At a step of FIG. 22 (A—A section), FIG. 23 (B—B section) and FIG. 24 (C—C section), subsequently, a polysilicon layer 38 doped with an n-type impurity in a high concentration is deposited on the whole upper surface of the intermediate product. The polysilicon layer 38 fills up the gate trench 6, and furthermore, is deposited till a thickness from the upper main surface of the semiconductor substrate 90 becomes larger than a certain extent. The polysilicon layer 38 is deposited by using a CVD method, for example.

Figure 25:
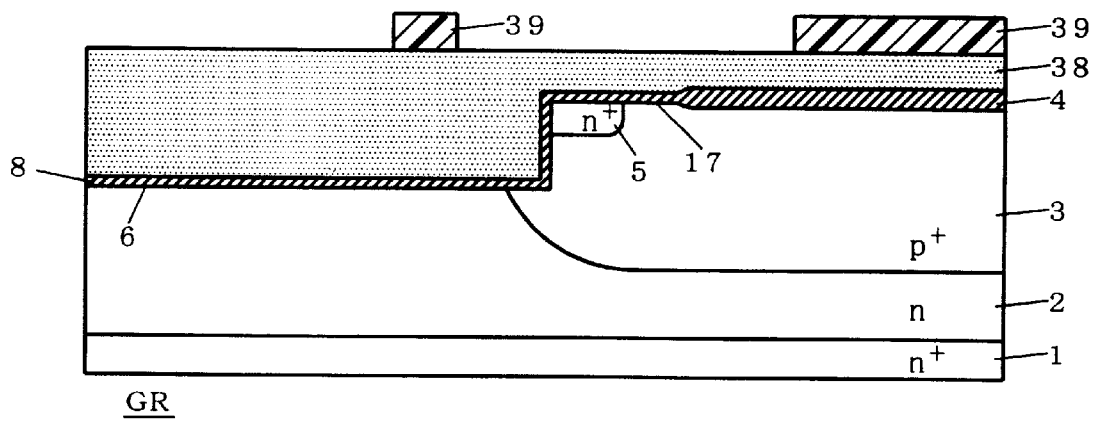
Figure 26:
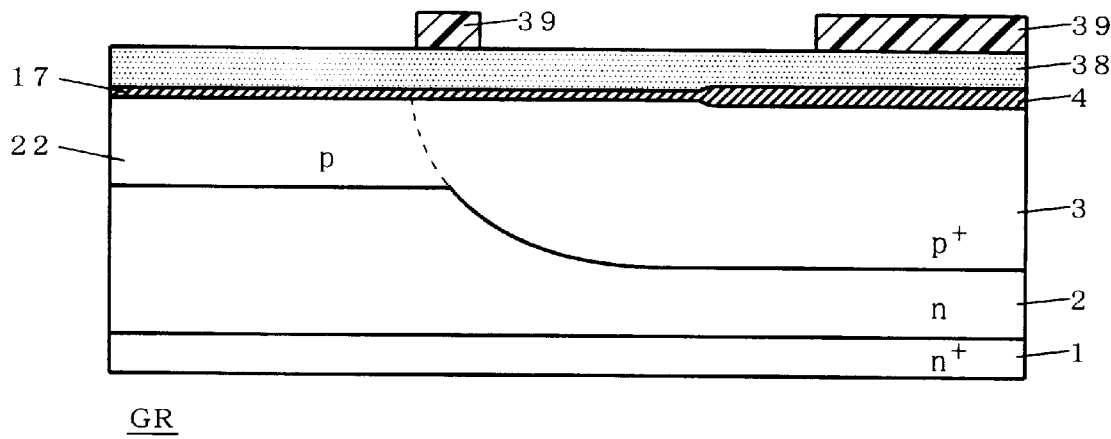
Figure 27:
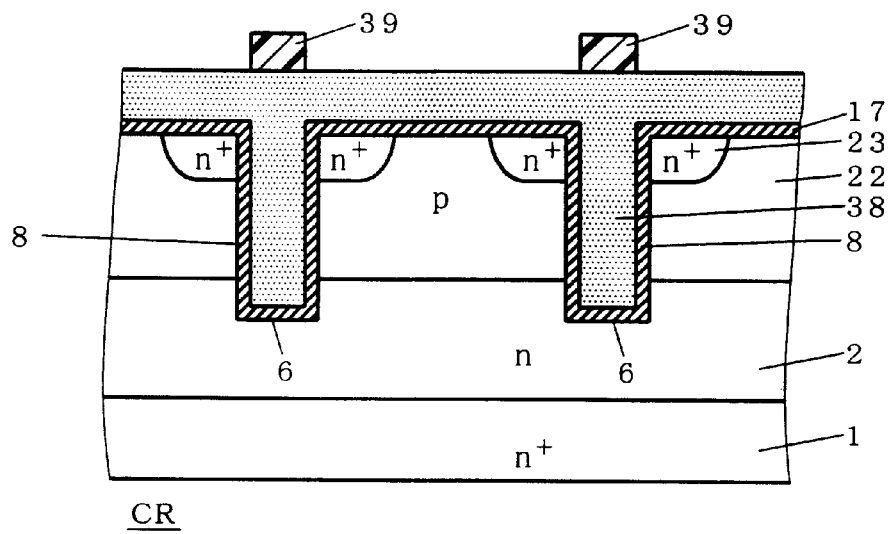

At a step of FIG. 25 (A—A section), FIG. 26 (B—B section) and FIG. 27 (C—C section), first of all, a resist layer is deposited on an upper surface of the polysilicon layer 38. Then, the resist layer is selectively removed excluding portions corresponding to a gate wiring 9 and a gate wiring 10. As a result, a resist pattern 39 is formed.

Figure 28:
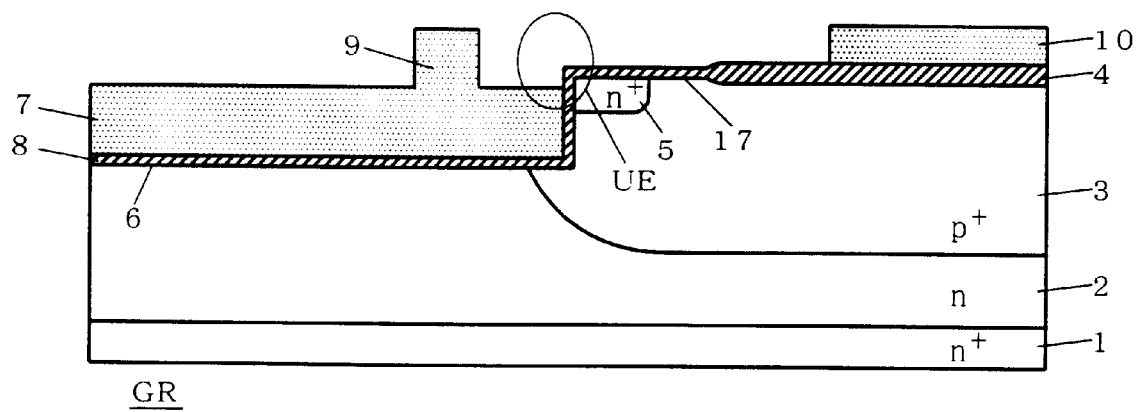
Figure 29:
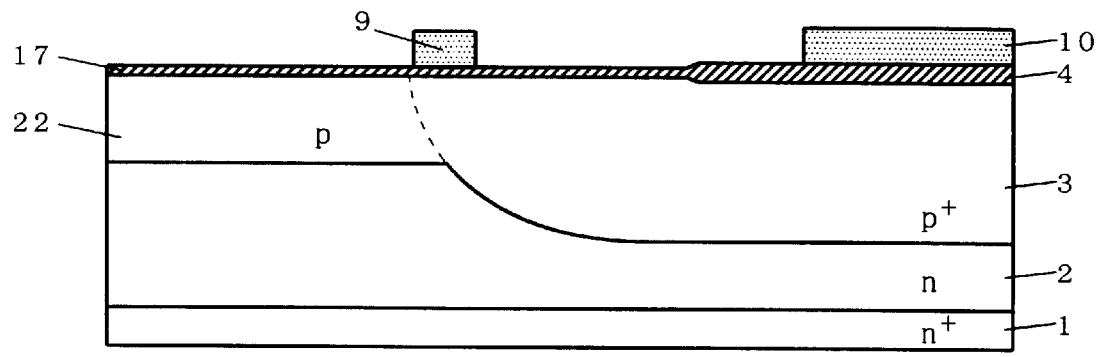
Figure 30:
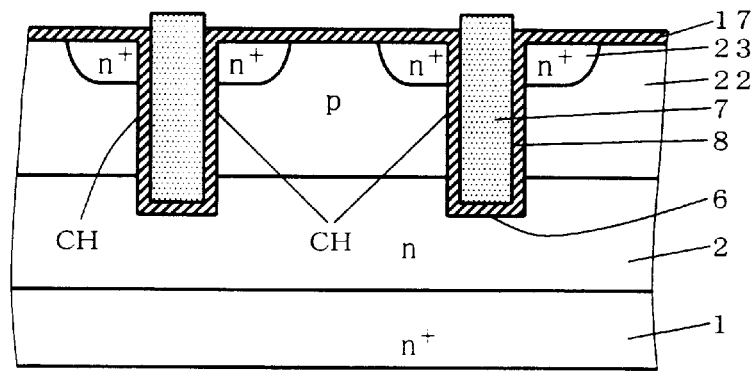

At steps of FIG. 28 (A—A section), FIG. 29 (B—B section) and FIG. 30 (C—C section), the polysilicon layer 38 is subjected to selective etching using the resist pattern 39 as a shield. Consequently, a gate electrode 7 and the gate wirings 9 and 10 are formed. At this step, the etching is controlled such that an upper surface of the gate electrode 7 is not positioned higher than the upper main surface of the semiconductor substrate 90 in the vicinity of an upper end UE.

Figure 31:
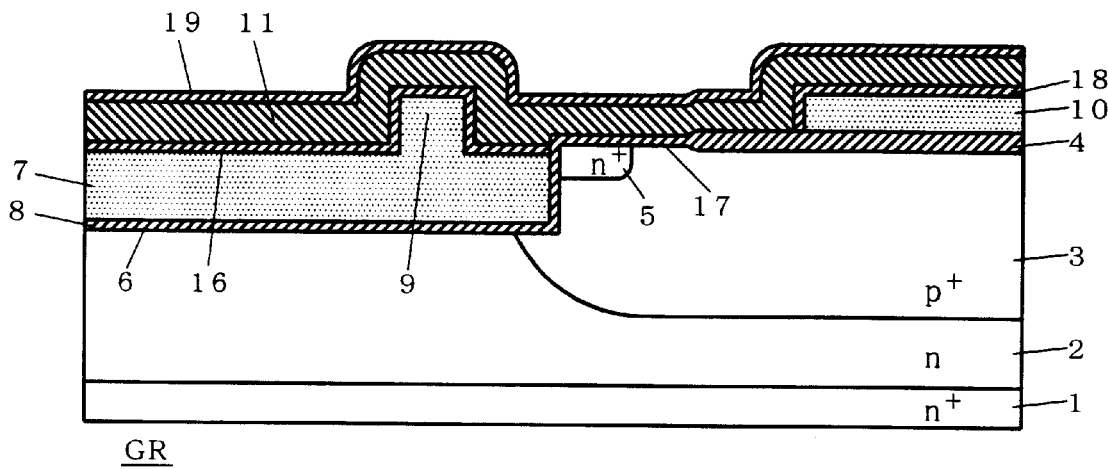
Figure 32:
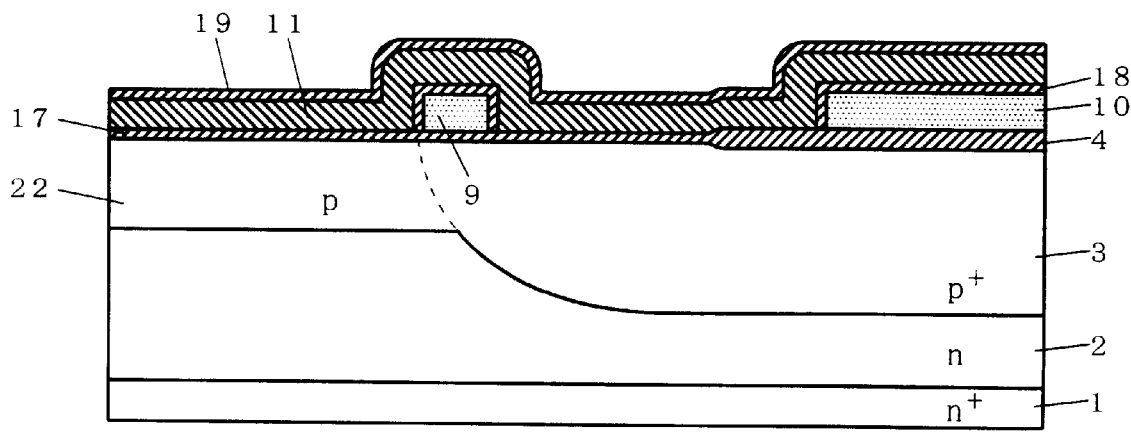
Figure 33:
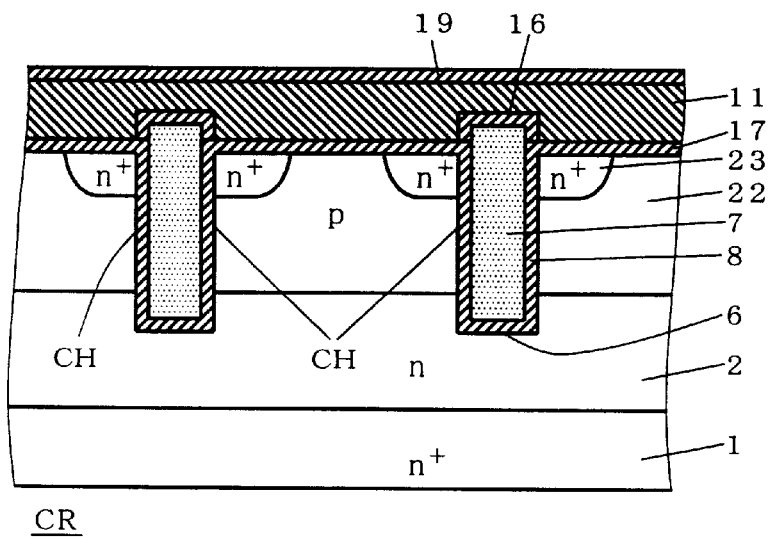

At a step of FIG. 31 (A—A section), FIG. 32 (B—B section) and FIG. 33 (C—C section), first of all, a thermal oxide film is formed on the whole surfaces of the gate electrode 7 and the gate wirings 9 and 10. More specifically, an insulating film 16 covering the surface of the gate electrode 7 and an insulating film 18 covering surfaces of the gate wirings 9 and 10 are formed in a thickness of about 20 to 30 nm, for example. Then, a BPSG layer 11 is formed on the insulating films 16 and 18 by using the CVD method. Thereafter, an oxide film as an insulating film 19 is formed in a thickness of about 100 nm, for example, on the BPSG layer 11 by using the CVD method. As a result, a multilayered insulator having a three-layer structure is obtained by the insulating films 16, 17 and 18, the BPSG layer 11 and the insulating film 19.

At a step of FIG. 34 (A—A section), FIG. 35 (B—B section) and FIG. 36 (C—C section), subsequently, the multilayered insulator is subjected to selective etching by using a resist pattern which is not shown. The selective etching is executed by using a wet method and a dry method. As a result, openings 20 and 21 and an opening for connecting the source electrode 14 to the semiconductor substrate 90 are formed on the multilayered insulator.

Then, an Al—Si layer is deposited to fill in each opening formed in the multilayered insulator and to cover an upper surface of the multilayered insulator. The Al—Si layer is deposited by using a sputtering method, for example.

Subsequently, the Al—Si layer is subjected to patterning. Consequently, the source electrode 14 and a gate wiring 13 are formed as shown in FIG. 1 and FIGS. 3 to 5. Then, a drain electrode 15 is formed on a surface of an n-type substrate layer 1, that is, a lower main surface of the semiconductor substrate 90. Thus, the device 101 is completed. The drain electrode 15 is formed by depositing a Ti/Ni/Au alloy on the surface of the n-type substrate layer 1 by using the sputtering method, for example.

As described above, the device 101 can easily be manufactured by combining conventionally well-known techniques such as photolithography, ion implantation, a CVD method, a thermal oxidation treatment and the like.

<2. Second Embodiment>

Figure 37:
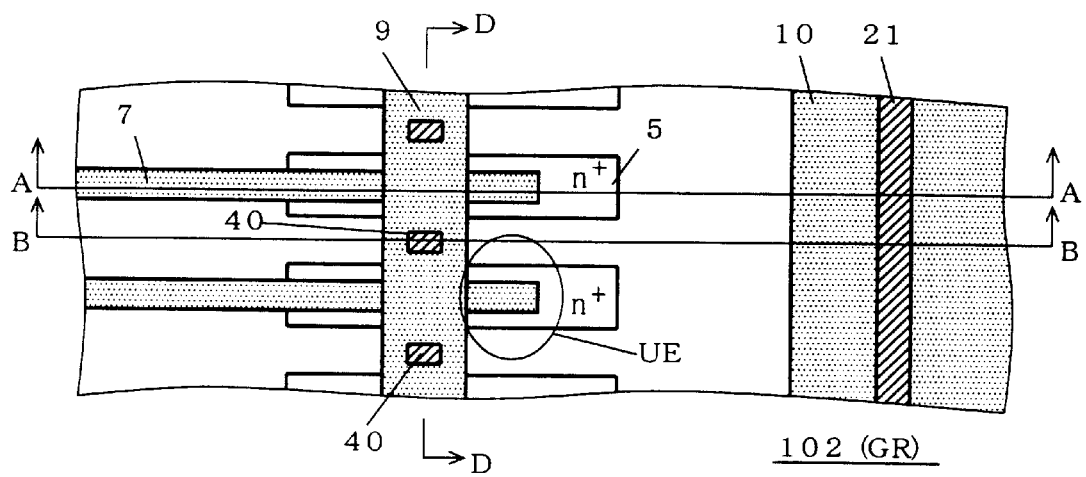
FIG. 37 is a plan view showing a device according to a second embodiment.
Figure 38:
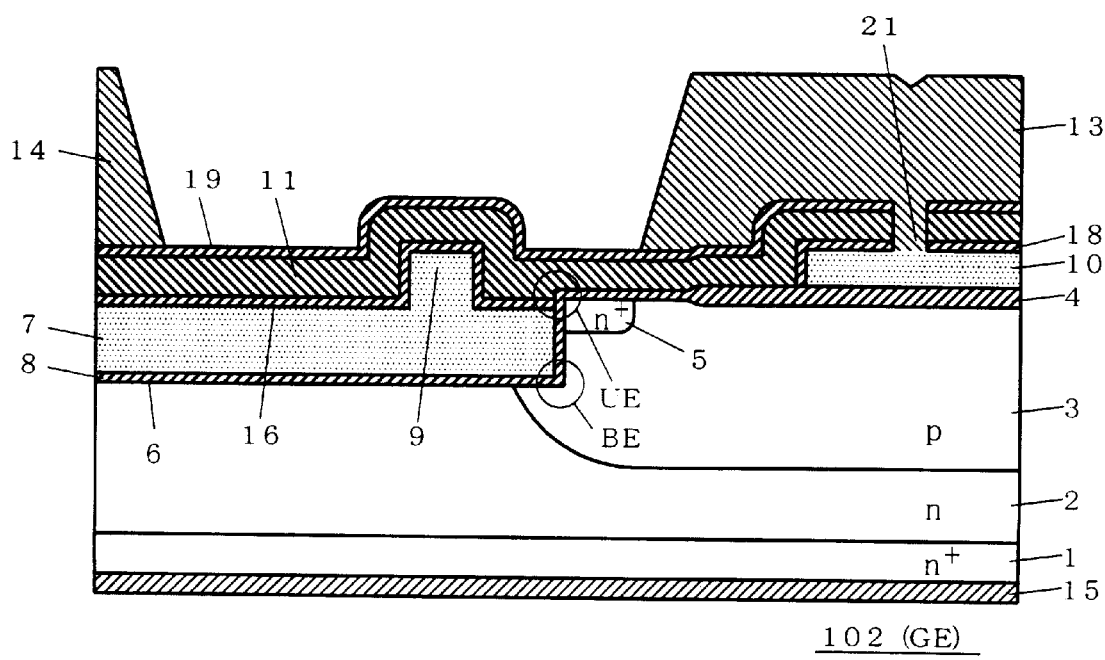
FIG. 38 is a sectional front view showing the device according to the second embodiment.
Figure 39:
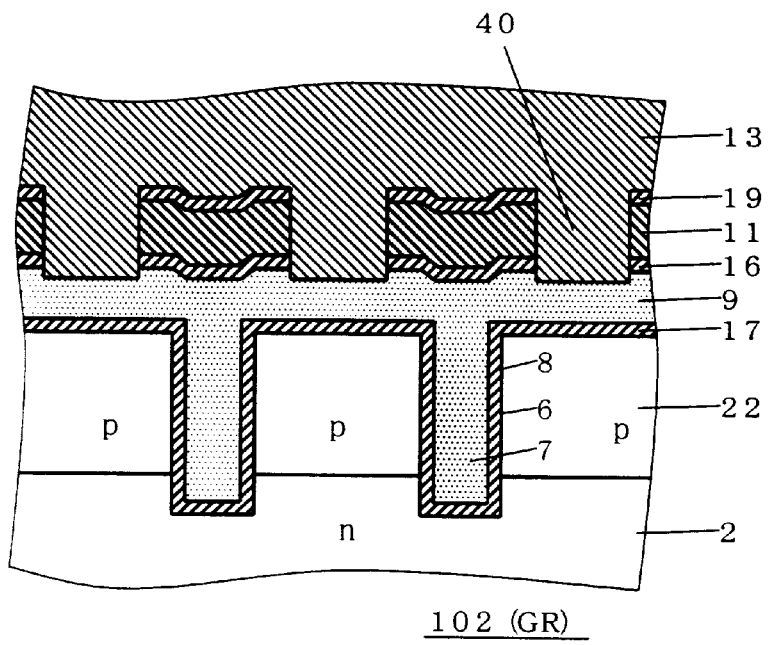
FIG. 39 is a sectional side view showing the device according to the second embodiment.

FIG. 37 is a plan view showing a gate wiring region GR of a device 102 according to a second embodiment. FIGS. 38 and 39 are sectional views taken along cutting lines A—A and D-D in FIG. 37, respectively. Moreover, a sectional view taken along a cutting line B—B in FIG. 37 is drawn identically to FIG. 4. As described above, furthermore, the sectional plan view of FIG. 3 is common to all the embodiments, and the cutting lines A—A and B—B shown in FIG. 37 correspond to the cutting lines A—A and B—B of FIG. 3, respectively.

The device 102 is characteristically different from the device 101 according to the first embodiment in that an opening 40 formed in a portion deposited on a gate wiring 9 in a multilayered insulator including a BPSG layer 11 keeps away from a portion provided above a gate trench 6. More specifically, the opening 40 is not formed like a band along the band-shaped gate wiring 9 but is formed at intervals for each region interposed between the adjacent gate trenches 6. A gate wiring 13 is connected to the gate wiring 9 through the opening 40.

As shown in FIG. 39, an upper surface of the BPSG layer 11 retreats somewhat downward in a position above the gate trench 6. More specifically, a periodic difference in height appears on the upper face of the BPS G layer 11 corresponding to an array of the gate trenches 6. The gate trench 6 has a width of about 1 $\mu$m, for example. On the other hand, the gate trench 6 has a space of about 3 $\mu$m, for example, which is usually set greater than the width of the gate trench 6. Accordingly, a flat portion of the BPSG layer 11 is narrow above the gate trench 6, and is wide above the region interposed between the gate trenches 6. The opening 40 is formed by selecting the wide flat portion. Therefore, alignment of a mask pattern for forming the opening 40 can be performed comparatively easily.

Moreover, a microfabrication processing is required when forming the opening 40. Therefore, dry etching is used. For this reason, an upper surface of the gate wiring 9 is also somewhat subjected to etch-back in a portion of the opening 40 as shown in FIG. 39, and so is the gate wiring 9 provided directly under the opening 20 (FIG. 1) according to the first embodiment. Consequently, the reliability of an insulating film 17 positioned directly under the gate wiring 9 is also affected.

Accordingly, it is desirable that the opening to be formed on the gate wiring 9 should be as narrow as possible in order to keep the reliability of the gate wiring 9 and the insulating film 17. The device 102 is more desirable than the device 101 in that the opening 40 is locally provided.

On the other hand, the position of the opening 20 does not need to be matched with a specific flat portion on the upper face of the BPSG layer 11 in the device 101 according to the first embodiment. Therefore, there is an advantage that the alignment of a mask pattern for forming the opening 20 requires less precision than in the opening 40 and manufacture can easily be performed. Moreover, the opening 20 has a great opening area. Therefore, a low contact resistance is generated between the gate wiring 13 and the gate wiring 9. Consequently, good results can be obtained for a switching speed of the device.

Figure 34:
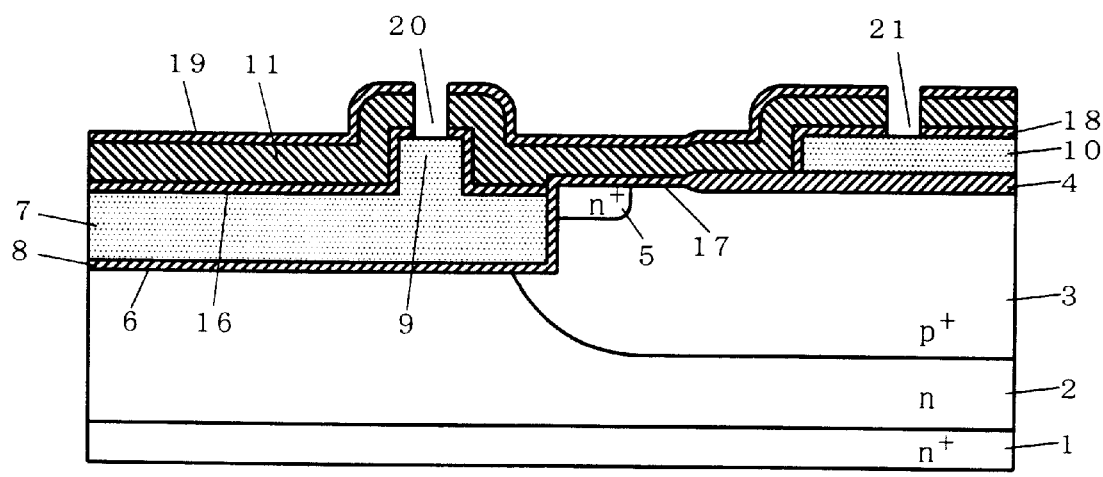
Figure 35:
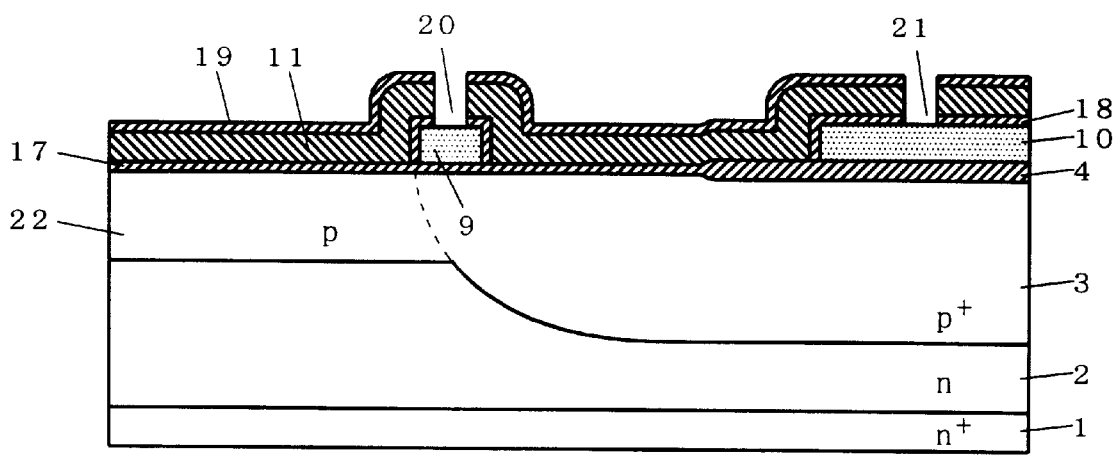
Figure 36:
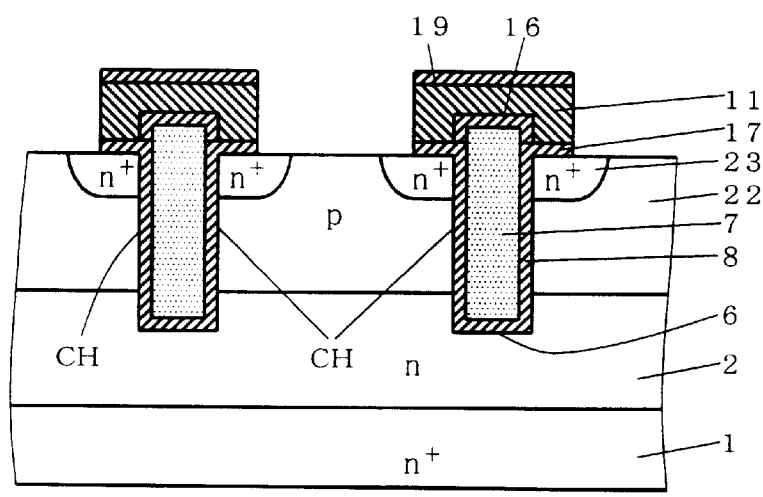

In order to manufacture the device 102, it is desirable that the BPSG layer 11 and the like should be selectively removed to form the opening 40 instead of forming the opening 20 at the steps of FIGS. 34 to 36 in the method for manufacturing the device 101. For this purpose, it is sufficient that a resist pattern acting as a shield which can form the opening 20 is simply replaced with a resist pattern capable of forming the opening 40.

Figure 40:
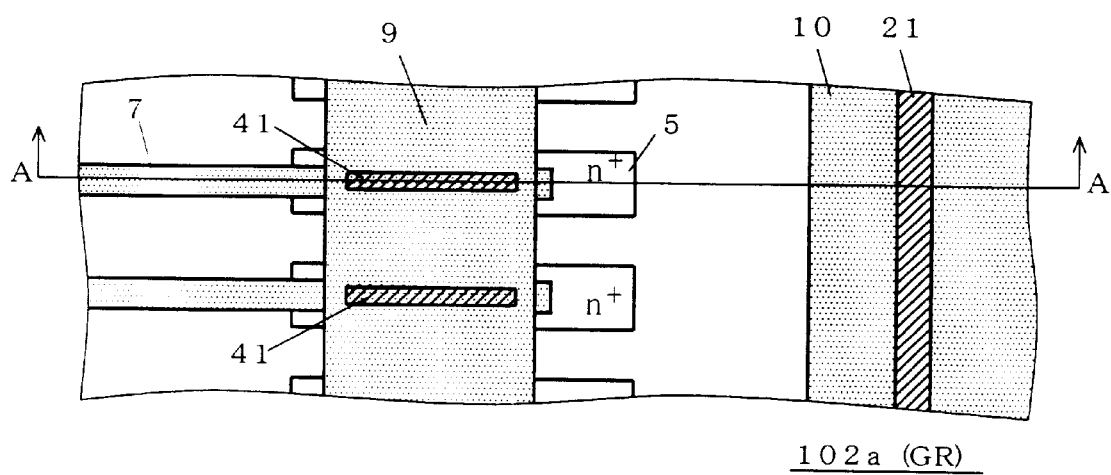
FIG. 40 is a plan view showing another example of the device according to the second embodiment.

FIG. 40 is a plan view showing a gate wiring region GR of another device 102a according to the second embodiment. The device 102a is characteristically different from the device 102 in that an opening 41 to be formed in a portion of a multilayered insulator including a BPSG layer 11 which is deposited on a gate wiring 9 is provided by selecting a portion above a gate trench 6. More specifically, the opening 41 is selectively formed in a position of the narrower flat portion in the upper surface of the BPSG layer 11 in FIG. 39.

An opening width of the opening 41 in a direction of an array of the gate trenches 6 is restricted. Therefore, it is desirable that the opening width of the opening 41 in a longitudinal direction of the gate trench 6 should be set large as shown in FIG. 40 in order to compensate for so-called loading effects of dry etching (a phenomenon in which an etching speed is reduced if the opening width is small). For this purpose, it is necessary to set the width of the gate wiring 9 large as shown in FIG. 40.

In the same manner as in the device 102, in the device 102a, the opening 41 is not only provided locally but also formed by keeping away from a portion above an insulating film 17 to select a portion above a gate electrode 7. Therefore, there is an advantage that the insulating film 17 can be prevented form being deteriorated due to the dry etching.

In order to manufacture the device 102a, it is desirable that the BPSG layer 11 and the like should be selectively removed to form the opening 41 instead of forming the opening 20 at the steps of FIGS. 34 to 36 in the method for manufacturing the device 101. For this purpose, it is sufficient that a resist pattern acting as a shield which can form the opening 20 is simply replaced with a resist pattern capable of forming the opening 41.

<3. Third Embodiment>

Figure 41:
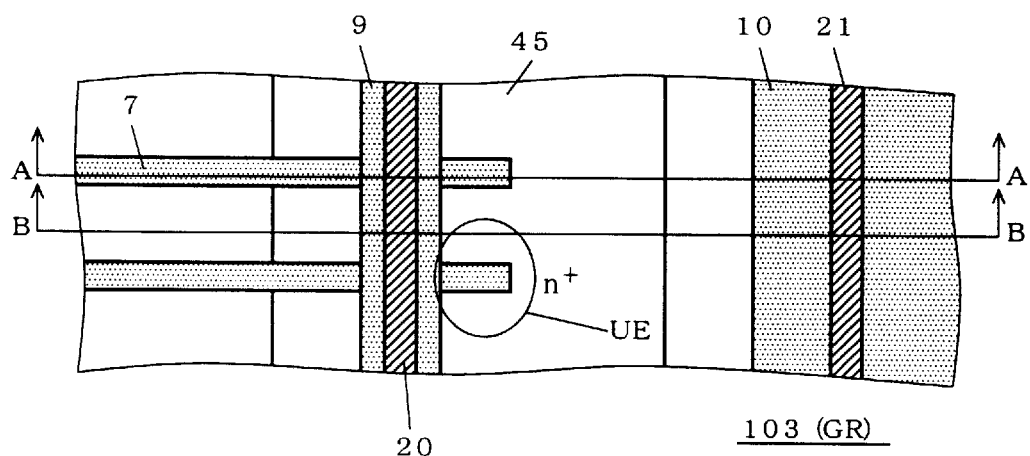
FIG. 41 is a plan view showing a device according to a third embodiment.
Figure 42:
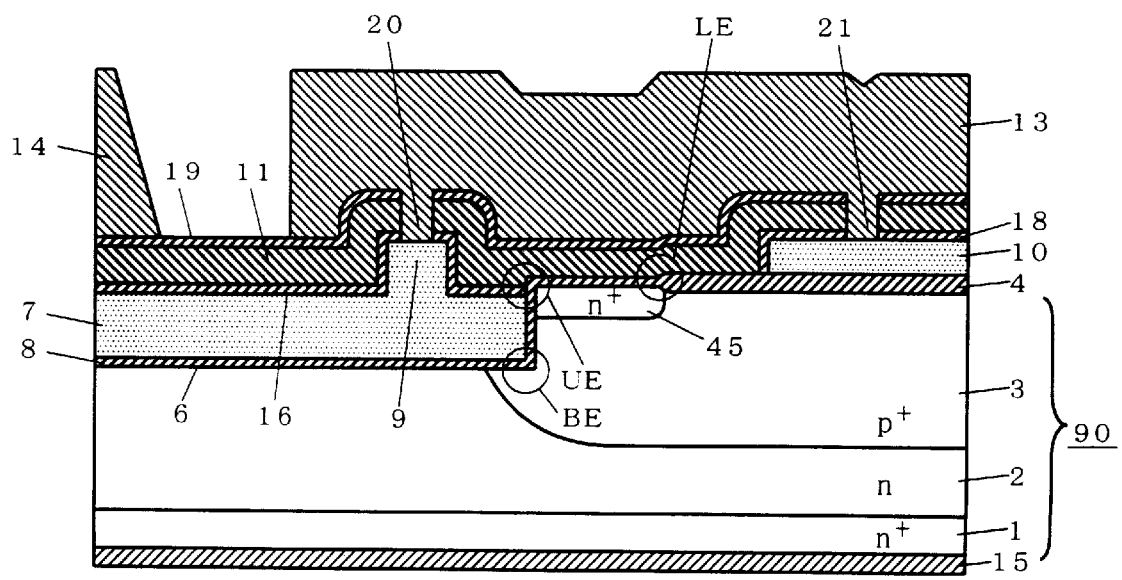
FIGS. 42 and 43 are sectional front views showing the device according to the third embodiment.
Figure 43:
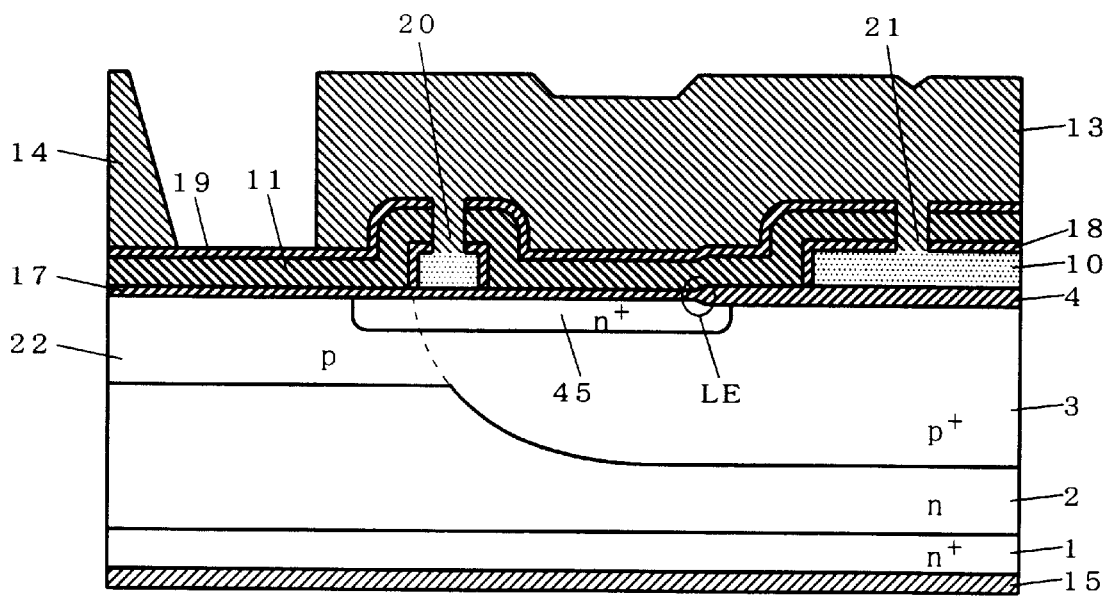

FIG. 41 is a plan view showing a gate wiring region GR of a device 103 according to a third embodiment. Moreover, FIGS. 42 and 43 are sectional views taken along cutting lines A—A and B—B in FIG. 41, respectively. The device 103 is characteristically different from the device 101 according to the first embodiment in that an n-type semiconductor layer 45 is formed in place of the n-type semiconductor layer 5.

The n-type semiconductor layer 45 formed to surround an upper end UE of a gate trench 6 is extended to a position where it overlaps with an insulating film 4. A connecting portion LE between an insulating film 17 formed comparatively thinly and the insulating film 4 formed thickly is a portion where a thermal stress remains. In some cases, moreover, the insulating film 17 is formed locally thinly as compared with an average thickness in the connecting portion LE. Thus, the connecting portion LE is a weak portion of the insulating film 17. In the device 103, the n-type semiconductor layer 45 also covers a portion directly under the connecting portion LE. Also in the connecting portion LE, therefore, the insulating film 17 is formed thickly. In other words, the device 103 is constituted to reinforce the weak portion in the insulating film 17.

Moreover, the n-type semiconductor layer 45 is also formed without a clearance between adjacent gate trenches 6 to cover the whole region corresponding to a portion directly under a gate wiring 9 in an upper main surface of a semiconductor substrate 90 as shown in FIGS. 41 and 43. As described above, in some cases, a portion in the insulating film 17 which is positioned directly under an opening 20 may be deteriorated at a dry etching step for forming the opening 20.

In the device 103, however, a region in the insulating film 17 which corresponds to the portion directly under the gate wiring 9 is covered with the n-type semiconductor layer 45. In this region, therefore, the insulating film 17 is formed thickly. Consequently, it is possible to compensate for the deterioration in the insulating film 17 caused by the dry etching. As shown in FIG. 41, moreover, the n-type semiconductor layer 45 is preferably formed like a band in a direction of an array of the gate trenches 6. In this configuration, alignment of a mask pattern for forming the n-type semiconductor layer 45 requires less precision. Therefore, manufacture can easily be performed.

In order to manufacture the device 103, it is desirable that arsenic should be selectively implanted to form the n-type semiconductor layer 45 instead of forming the n-type semiconductor layer 5 at the steps of FIGS. 13 to 15 in the method for manufacturing the device 101. For this purpose, it is preferable that patterning of a resist layer 35 should be performed to have an opening in portions corresponding to an n-type semiconductor layer 23 and the n-type semiconductor layer 45.

Figure 44:
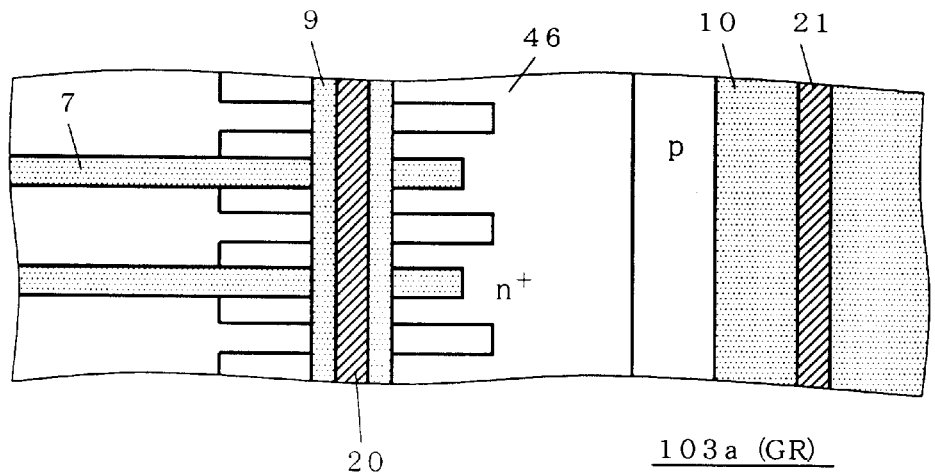
FIG. 44 is a plan view showing another example of the device according to the third embodiment.

FIG. 44 is a plan view showing a gate wiring region GR of another device 103a according to a third embodiment. In the device 103a, an n-type semiconductor layer 46 is formed in place of the n-type semiconductor layer 45. The n-type semiconductor layer 46 formed to surround an upper end UE of a gate trench 6 is provided so as not to wholly cover a region corresponding to a portion directly under a gate wiring 9 in an upper main surface of a semiconductor substrate 90 differently from the n-type semiconductor layer 45. However, the n-type semiconductor layer 46 is also formed to cover a portion directly under a connecting portion LE in the same manner as the n-type semiconductor layer 45. Consequently, a weak portion in an insulating film 17 is reinforced in the same manner as in the device 103.

In order to manufacture the device 103a, it is desirable that arsenic should be selectively implanted to form the n-type semiconductor layer 46 instead of forming the n-type semiconductor layer 5 at the steps of FIGS. 13 to 15 in the method for manufacturing the device 101. For this purpose, it is preferable that patterning of a resist layer 35 should be executed to have an opening in portions corresponding to an n type semiconductor layer 23 and the n-type semiconductor layer 46.

<4. Fourth Embodiment>

Figure 45:
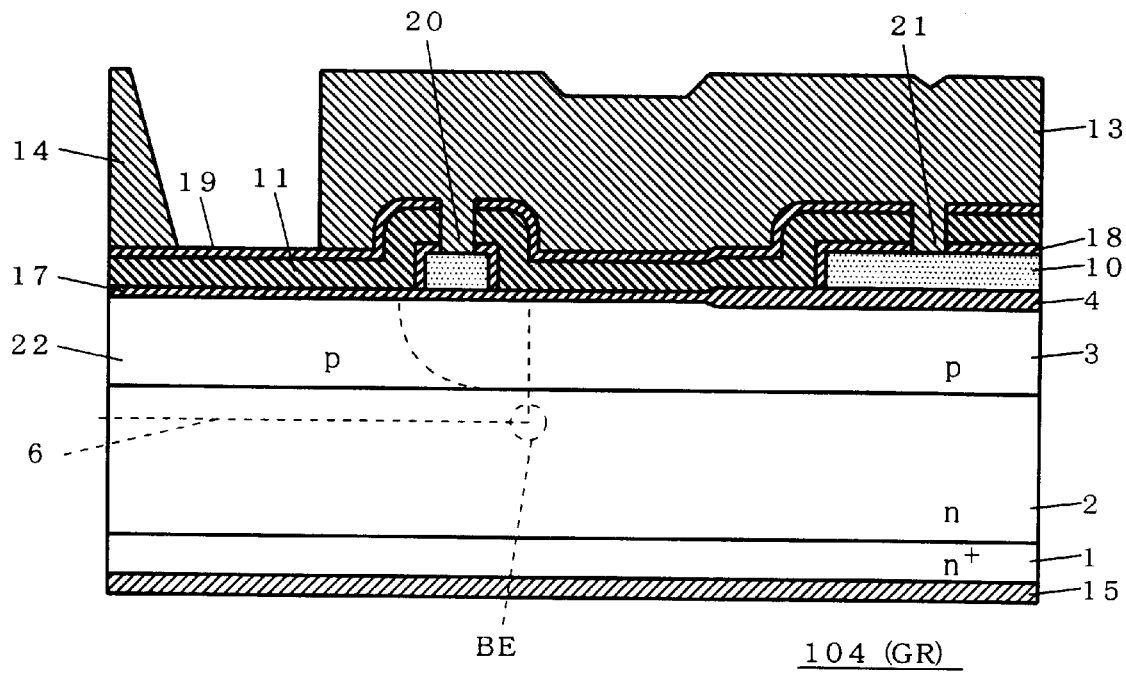
FIG. 45 is a sectional front view showing a device according to a fourth embodiment.

FIG. 45 is a sectional view showing a gate wiring region GR of a device 104 according to a fourth embodiment, which is taken along a cutting line B—B (FIG. 2). The device 104 is characteristically different from the device 101 according to the first embodiment in that a p well layer 3 is formed to have the same depth as a depth of a p-type semiconductor layer 22. For this reason, a lower end BE on an edge of a gate trench 6 along its longitudinal direction is not covered with the p well layer 3 but is directly surrounded by an n-type epitaxial layer 2.

In order to keep a high breakdown voltage of the device, it is desirable that the lower end BE should be covered with the p well layer 3 as in the device 101 according to the first embodiment. In the device 104, however, if an impurity concentration in the p well layer 3 is set equal to that in the p-type semiconductor layer 22, there is an advantage that the p well layer 3 and an n-type semiconductor layer 23 can be formed at the same time and a manufacturing process can be simplified. In this case, the p well layer 3 is identical to a p-type semiconductor layer 22 that is simply extended to a region of the p well layer 3. The device 104 is suitable for applications in which a breakdown voltage to be required is not very high.

Figure 9:
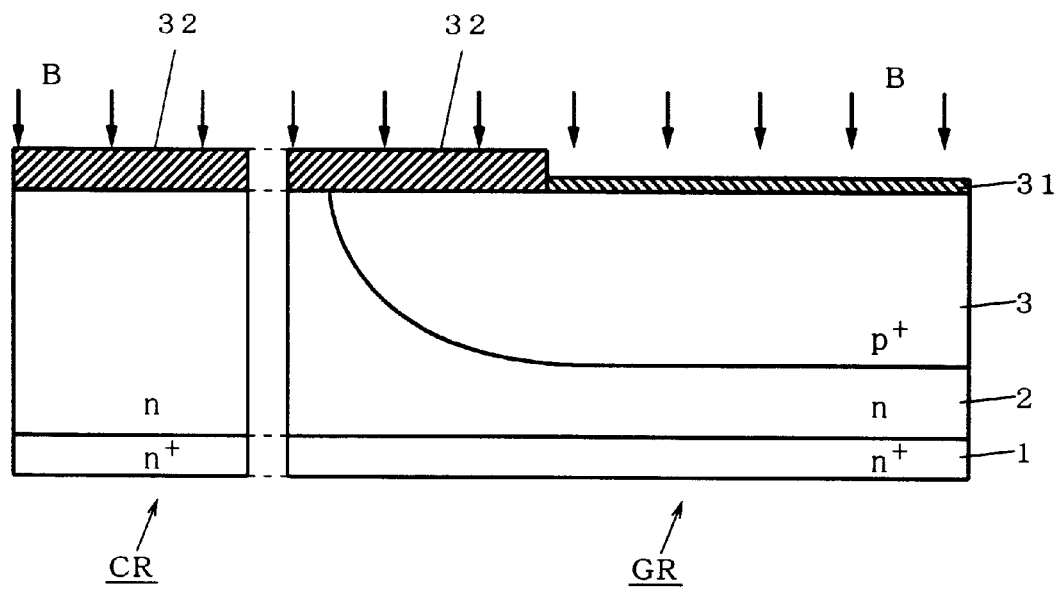

In order to manufacture the device 104, it is preferable that the step of FIG. 9 in the method for manufacturing the device 101 should be omitted and the p-type semiconductor layer 22 should be enlarged up to the region of the p well layer 3 at the steps of FIGS. 10 and 11. For this purpose, it is desirable that the resist layer 33 shown in FIG. 10 should be selectively opened in regions corresponding to both the p-type semiconductor layer 22 and the p well layer 3.

<5. Fifth Embodiment>

Figure 46:
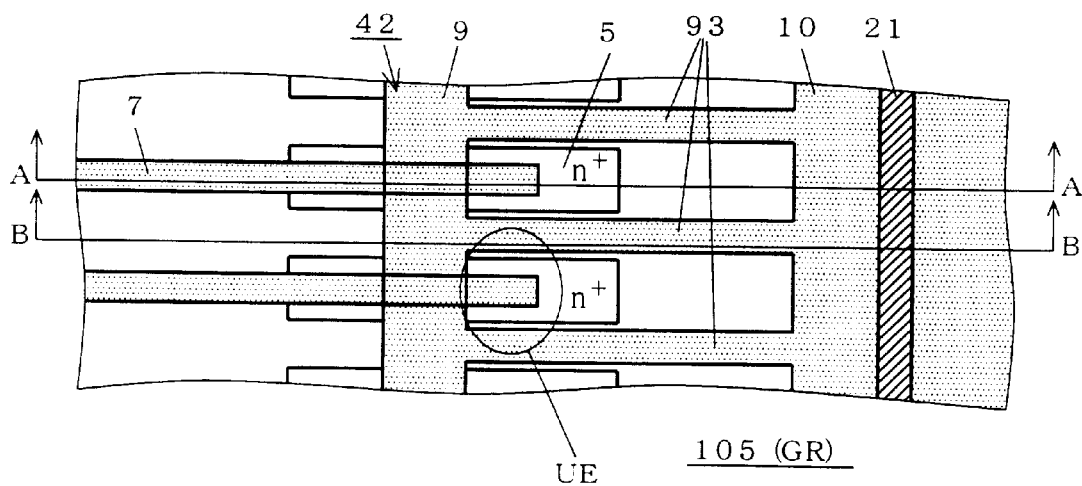
FIG. 46 is a plan view showing a device according to a fifth embodiment.
Figure 47:
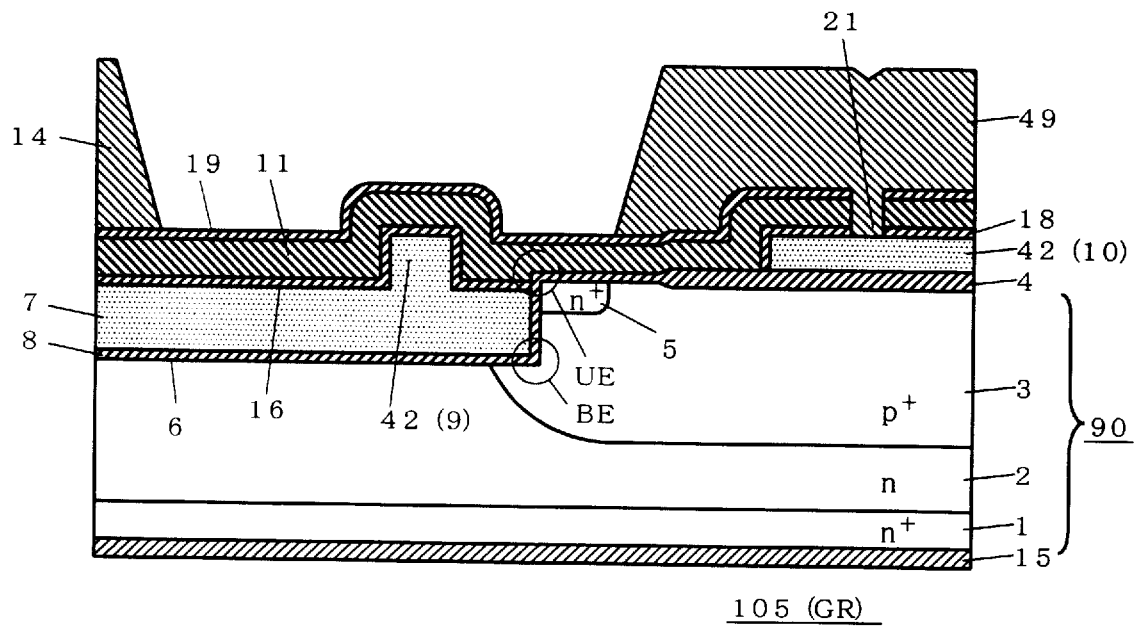
FIGS. 47 and 48 are sectional front views showing the device according to the fifth embodiment.
Figure 48:
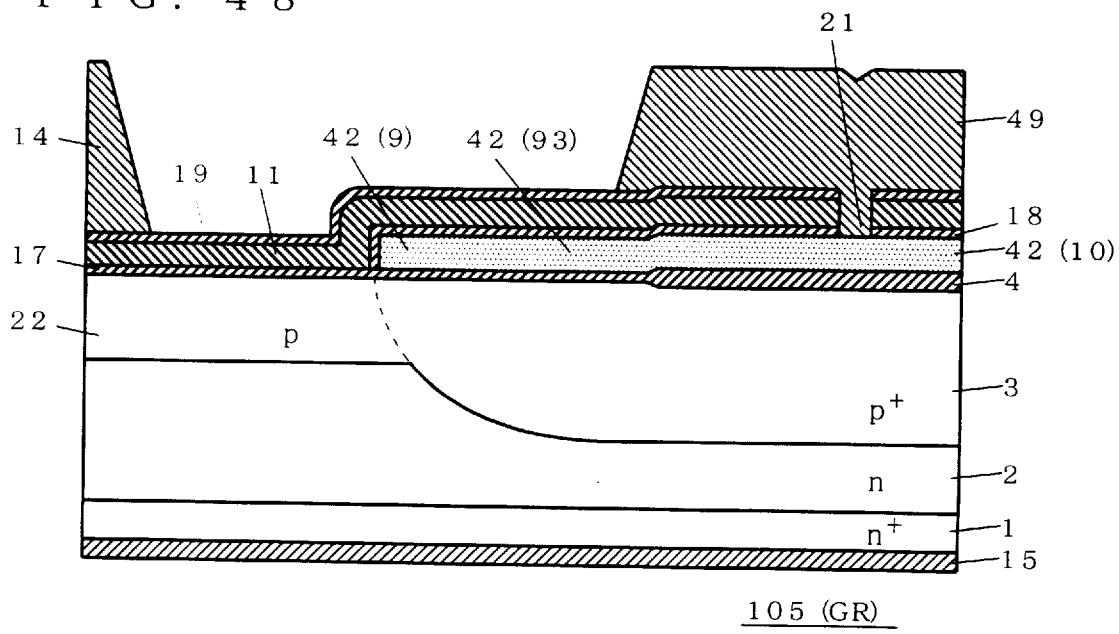
Figure 49:
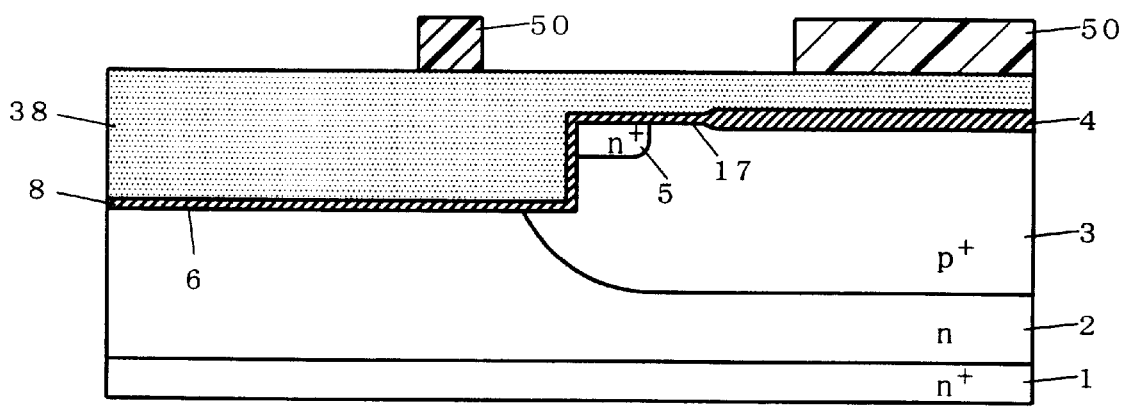
FIGS. 49 to 60 are views showing a process of manufacturing the device according to the fifth embodiment.
Figure 50:
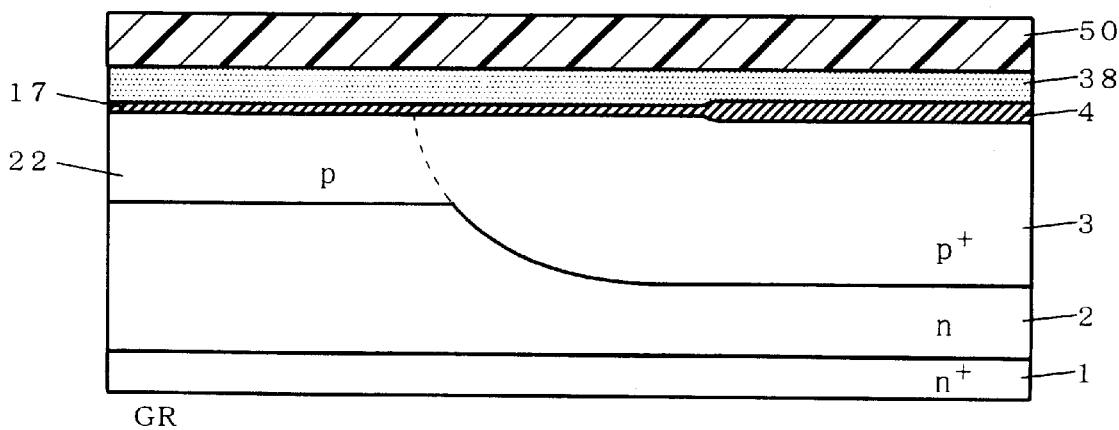

FIG. 46 is a plan view showing a gate wiring region GR of a device 105 according to a fifth embodiment. Moreover, FIGS. 47 and 48 are sectional views taken along cutting lines A—A and B—B in FIG. 46, respectively. The cutting lines A—A and B—B shown in FIG. 46 correspond to the cutting lines A—A and B—B shown in FIG. 3, respectively.

The device 105 is characteristically different from the device 101 according to the first embodiment in that an opening of a multilayered insulator including a BPSG layer 11 is not provided on a gate wiring 9 but the gate wiring 9 and a gate wiring 10 are connected to each other by a gate wiring 93 provided on an upper main surface of a semiconductor substrate 90 through an insulating film 17 so as to be kept away from a gate trench 6. The gate wiring 93 is formed of the same maternal as materials of the gate wirings 9 and 10, and furthermore, is continuously provided integrally with the gate wirings 9 and 10. More specifically, the gate wirings 9, 10 and 93 constitute one gate wiring 42 which is integrally continuous.

In place of the gate wiring 13 in the device 101, a gate wiring 49 is formed. The gate wiring 49 is formed of the same material as a material of a source electrode 14 in the same manner as the gate wiring 13. The gate wiring 49 is electrically connected to the gate wiring 10 through an opening 20.

Also in the device 104, the gate wiring is provided to be kept away from an upper end UE of the gate trench 6. Therefore, a concentration of an electric field generated on a gate insulating film 8 and an insulating film 17 in the upper end UE by the application of a gate voltage can be relieved or eliminated.

Consequently, a breakdown voltage of the device 104 and a yield of a product can be enhanced. Moreover, since the gate wiring 9 is not connected to the gate wiring 10 through an opening provided in the BPSG layer 11 and the like but is continuously provided integrally with the gate wiring 10 through the gate wiring 93, it is possible to obtain an advantage that an electric resistance between the gate wiring 9 and the gate wiring 10 is low and a switching speed of the device can be enhanced. Furthermore, since an opening is not formed in an upper portion of the gate wiring 9, there is an advantage that a deterioration in the insulating film 17 caused by dry etching can be avoided.

As compared with the device 101, in the device 101 according to the first embodiment, alignment of a mask pattern which is required to form the gate wiring 93 and the gate trench 6 is not necessary therebetween, and therefore, there is an advantage that manufacture can easily be performed. Moreover, a connecting portion LE of an insulating film 4 and the insulating film 17 is not covered with the gate wiring 93. Therefore, there is an advantage that the breakdown voltage and reliability of the device can be enhanced.

In order to manufacture the device 105, it is preferable that the steps of FIGS. 8 to 24 in the method for manufacturing the device 101 should be executed and steps of FIGS. 49 to 56 should be then executed. At the step of FIG. 49 (A—A section) and FIG. 50 (B—B section), first of all, a resist layer is deposited on an upper face of a polysilicon layer 38. Then, the resist layer is selectively removed excluding a portion corresponding to the gate wiring 42. As a result, a resist pattern 50 is formed.

Figure 51:
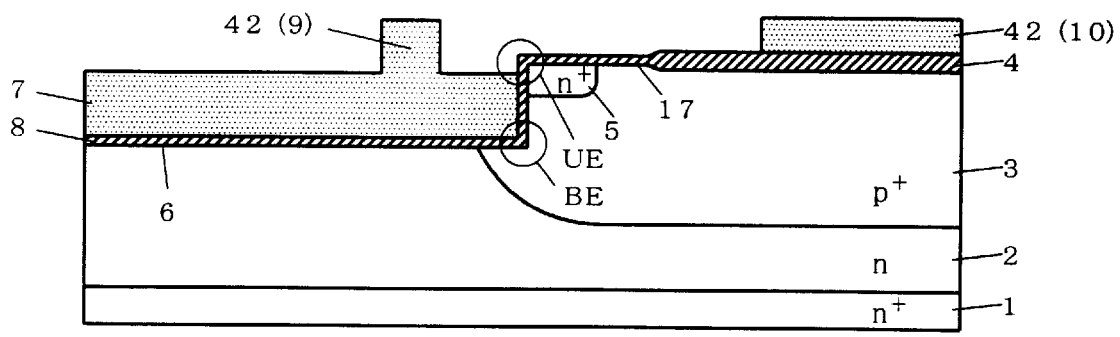
Figure 52:
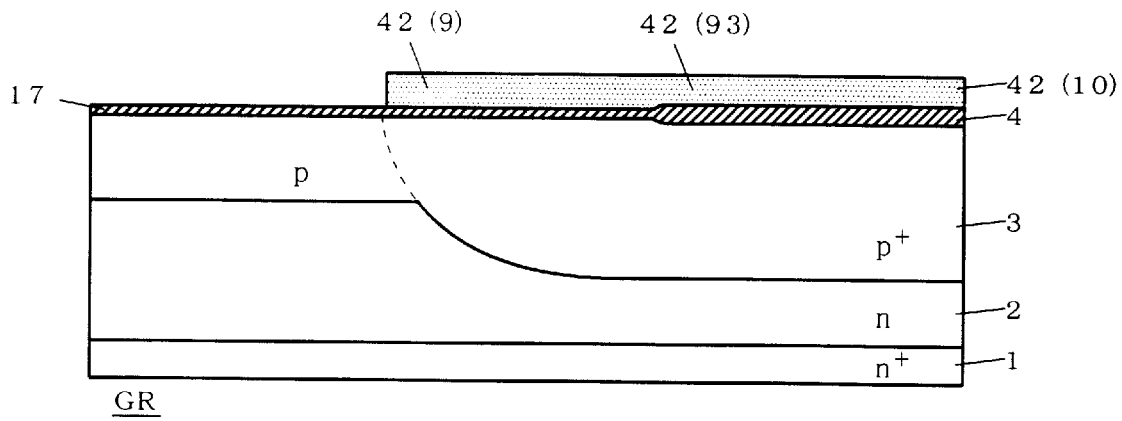

At the next step of FIG. 51 (A—A section) and FIG. 52 (B—B section), the polysilicon layer 38 is subjected to selective etching by using the resist pattern 50 as a shield. Consequently, a gate electrode 7 and the gate wiring 42 are formed. At this step, the etching is controlled such that an upper surface of the gate electrode 7 is not positioned above the upper main surface of the semiconductor substrate 90 in the vicinity of the upper end UE.

At the step of FIG. 53 (A—A section) and FIG. 54 (B—B section), subsequently, a thermal oxide film is first formed on the whole surfaces of the gate electrode 7 and the gate wiring 42. More specifically, an insulating film 16 covering a surface of the gate electrode 7 and an insulating film 18 covering a surface of the gate wiring 42 are formed in thicknesses of about 20 to 30 nm, for example. Then, a BPSG layer 11 is formed on the insulating films 16 and 18 by using a CVD method. Thereafter, an oxide film as an insulating film 19 is formed in a thickness of about 100 nm, for example, on the BPSG layer 11 by using the CVD method. As a result, a multilayered insulator having a three-layer structure can be obtained by the insulating films 16, 17 and 18, the BPSG layer 11 and the insulating film 19.

Figure 55:
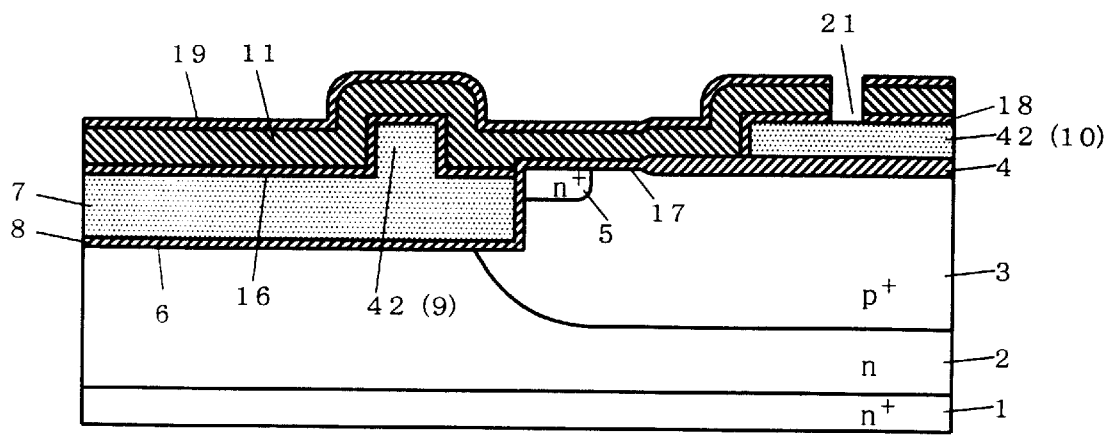
Figure 56:
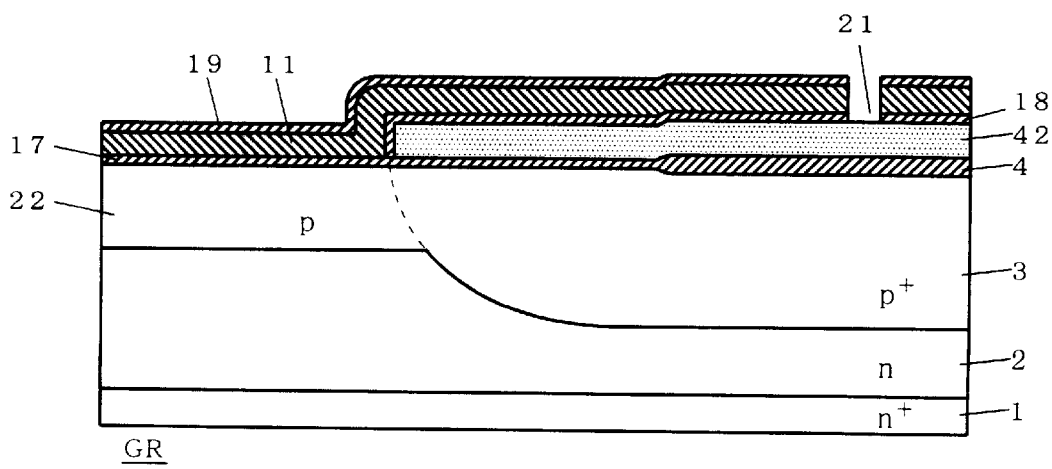

At the next step of FIG. 55 (A—A section) and FIG. 56 (B—B section), a multilayered insulator is subjected to selective etching by using a resist pattern which is not shown. The selective etching is executed by using a wet method and a dry method. As a result, an opening 21 and an opening for connecting a source electrode 14 and the semiconductor substrate 90 are formed on the multilayered insulator.

Then, an Al—Si layer is deposited to fill in each opening formed in the multilayered insulator and to cover an upper face of the multilayered insulator. The Al—Si layer is deposited by a sputtering method, for example.

Subsequently, the Al—Si layer is subjected to patterning, thereby forming the source electrode 14 and a gate wiring 49 as shown in FIGS. 47 and 48. Then, a drain electrode 15 is formed on a surface of an n-type substrate layer 1, that is, a lower main surface of the semiconductor substrate 90. Thus, the device 105 is completed. The drain electrode 15 is formed by depositing a Ti/Ni/Au alloy on the surface of the n-type substrate layer 1 by using the sputtering method, for example.

As described above, the device 105 can easily be manufactured by combining conventionally well-known techniques such as photolithography, ion implantation, a CVD method, a thermal oxidation treatment and the like in the same manner as in the method for manufacturing the device 101.

Figure 57:
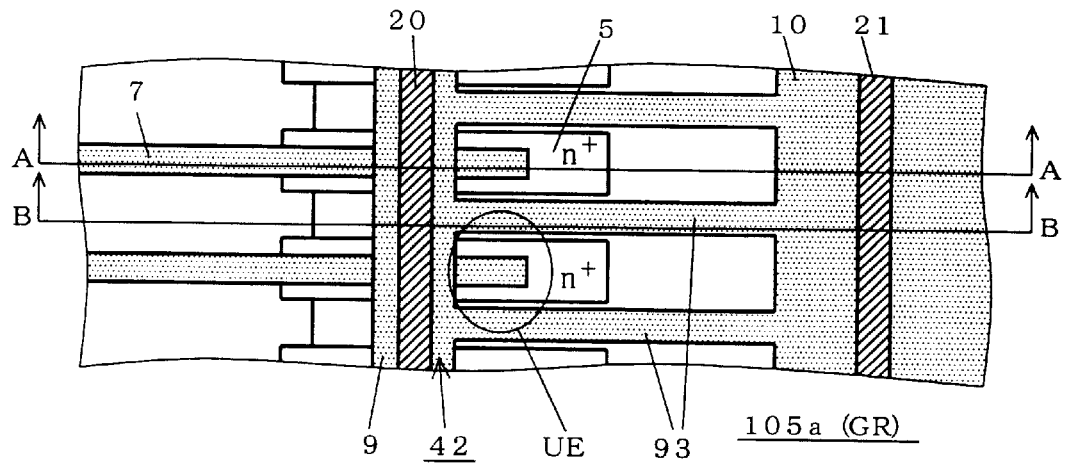
Figure 58:
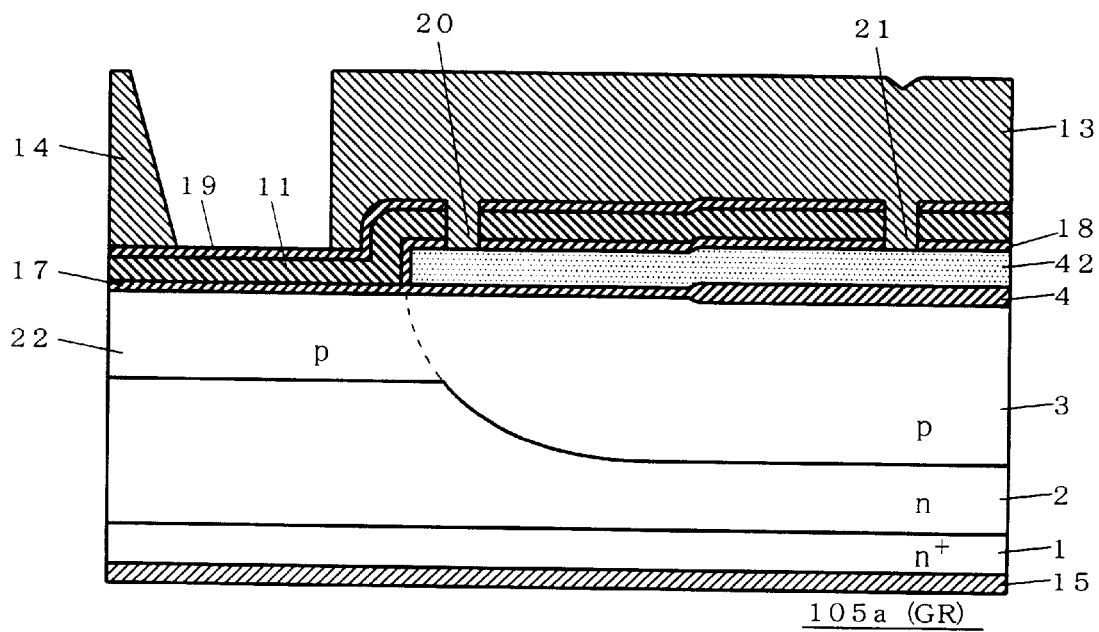

FIG. 57 is a plan view showing a gate wiring region GR of another device 105*a* according to the fifth embodiment. FIG. 58 is a sectional view taken along a cutting line B—B in FIG. 57. Moreover, a sectional view taken along a cutting line A—A in FIG. 57 is represented in the same manner as FIG. 1.

The device 105*a* is characteristically different from the device 105 in that an opening 20 is provided in a BPSG layer 11 and the like over a gate wiring 9 included in a gate wiring 42, and the gate wiring 9 and a gate wiring 10 are connected through a gate wiring 13 filling in the openings 20 and 21 as well as a gate wiring 93. Since the gate wiring 9 and the gate wiring 10 are connected through both the gate wiring 93 and the gate wiring 13, an electric resistance therebetween is reduced. As a result, it is possible to obtain an advantage that a switching speed of the device can be enhanced.

Figure 53:
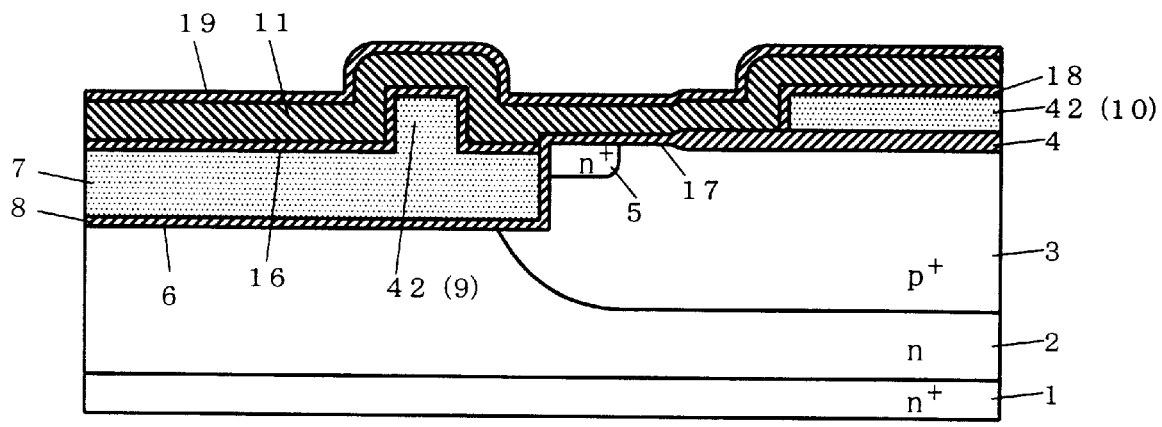
Figure 54:
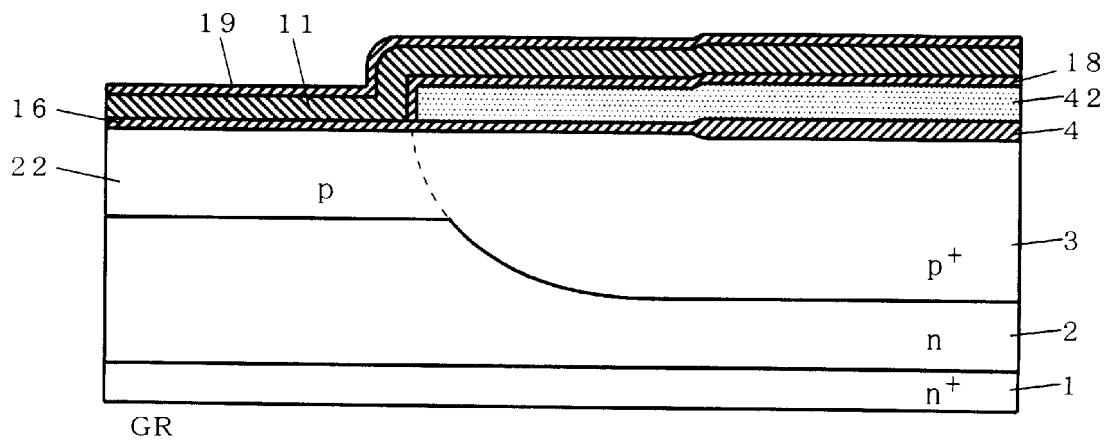
Figure 59:
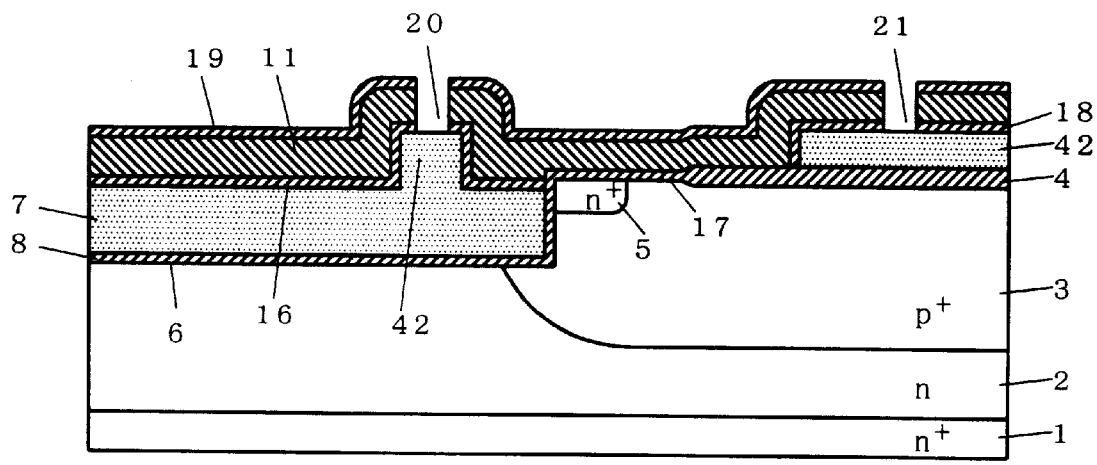
Figure 60:
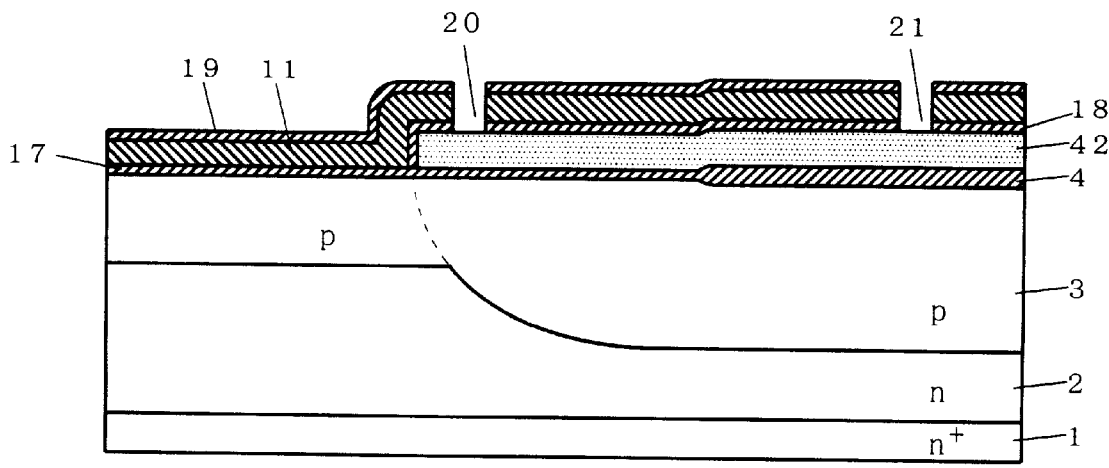

In order to manufacture the device 105a, it is preferable that a step of FIGS. 59 and 60 should be executed after the step of FIGS. 53 and 54 in the method for manufacturing the device 105 are completed. At the step of FIG. 59 (A—A section) and FIG. 60 (B—B section), first of all, a multi-layered insulator is subjected to selective etching by using a resist pattern which is not shown. The selective etching is executed by using a wet method and a dry method. As a result, openings 20 and 21 and an opening for connecting a source electrode 14 and a semiconductor substrate 90 are formed on the multilayered insulator.

Then, an Al—Si layer is deposited to fill in each opening formed in the multilayered insulator and to cover an upper face of the multilayered insulator. The Al—Si layer is deposited by using the sputtering method, for example.

Subsequently, the Al—Si layer is subjected to patterning, thereby forming the source electrode 14 and the gate wiring 13 as shown in FIG. 58. Thereafter, a drain electrode 15 is formed on a surface of an n-type substrate layer 1, that is, a lower main surface of the semiconductor substrate 90. Thus, the device 101 is completed. The drain electrode 15 is formed by depositing a Ti/Ni/Au alloy on the surface of the n-type substrate layer 1 by using the sputtering method, for example.

<6. Sixth Embodiment>

Figure 61:
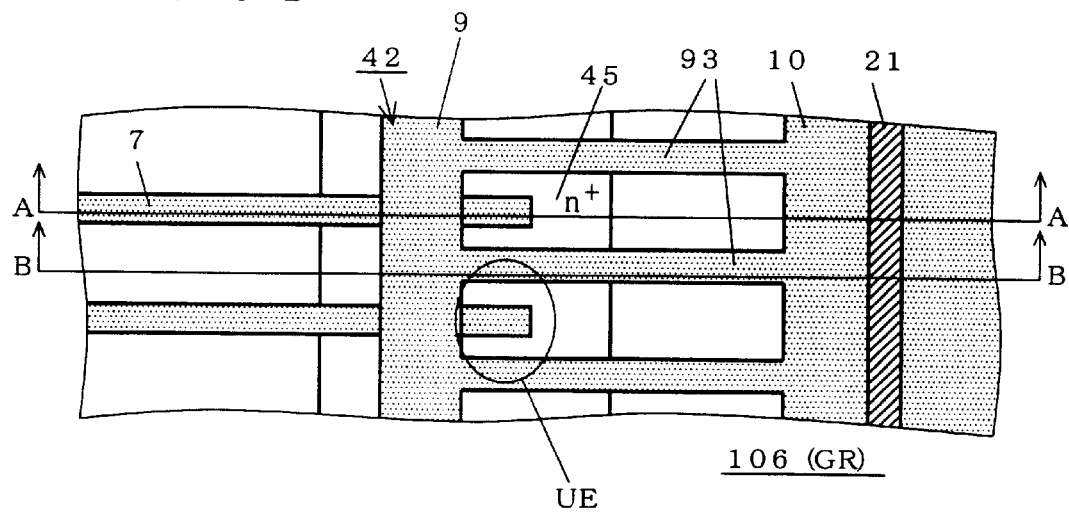
FIG. 61 is a plan view showing a device according to a sixth embodiment.
Figure 62:
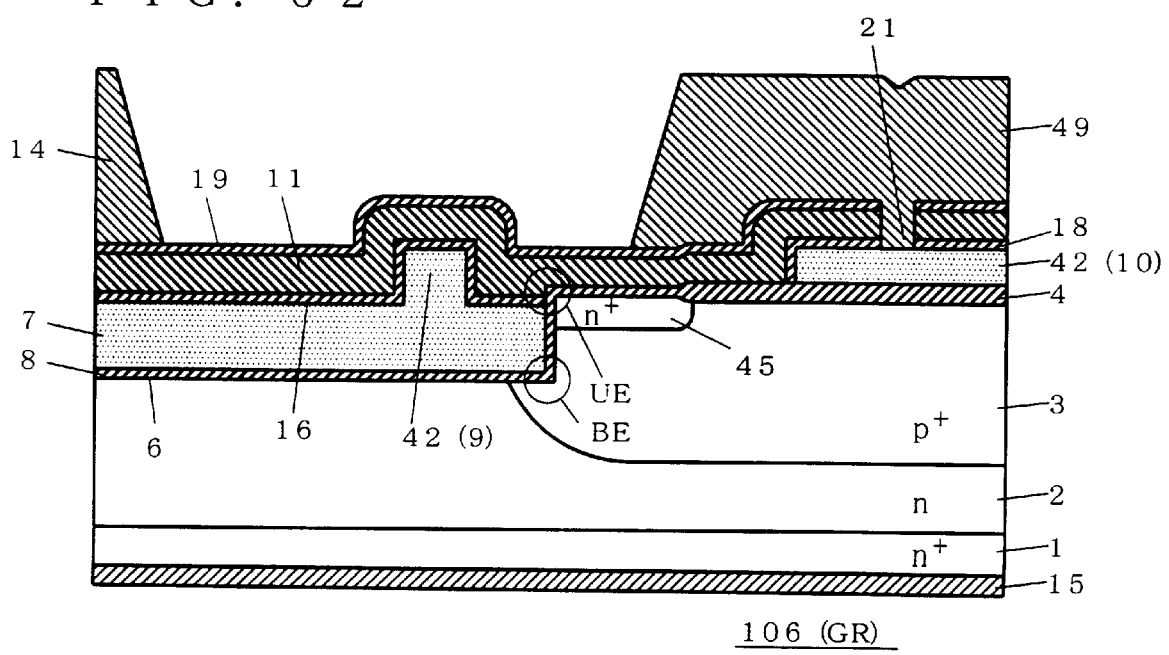
FIGS. 62 and 63 are sectional front views showing the device according to the sixth embodiment.
Figure 63:
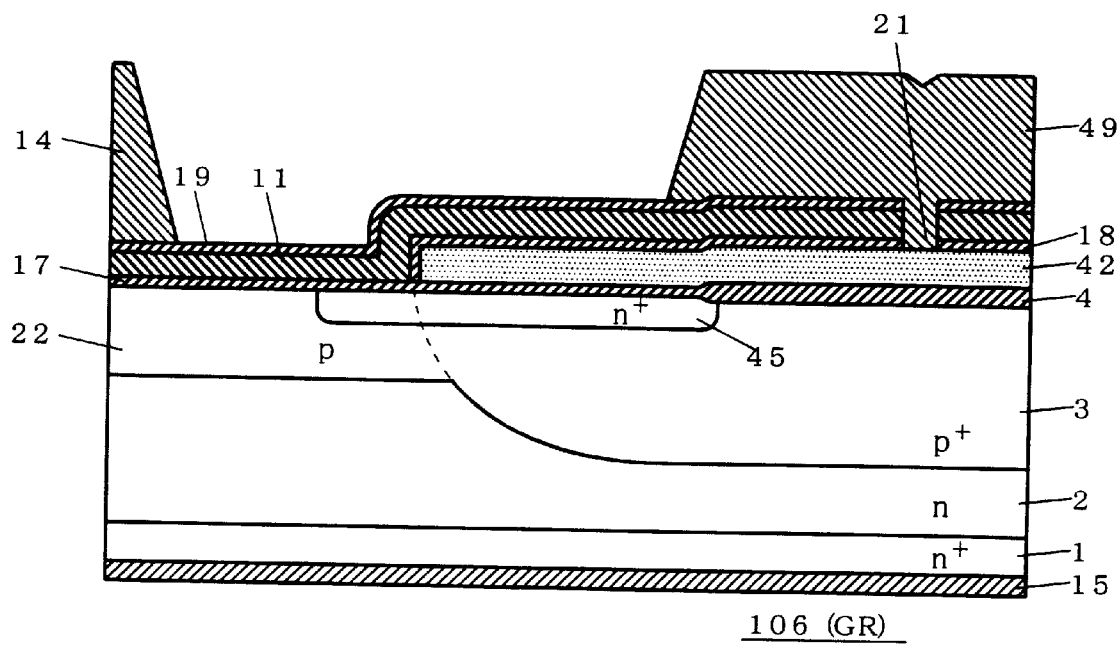

FIG. 61 is a plan view showing a gate wiring region GR of a device 106 according to a sixth embodiment. Moreover, FIGS. 62 and 63 are sectional views taken along cutting lines A—A and B—B in FIG. 61, respectively. In the same manner as in the device 103 according to the third embodiment, the device 106 is characteristically different from the device 105 according to the fifth embodiment in that an n-type semiconductor layer 45 is formed in place of the n-type semiconductor layer 5.

In the device 106, the n-type semiconductor layer 45 also covers a portion directly under a connecting portion LE. Also in the connecting portion LE of an insulating film 17 and an insulating film 4, therefore, the insulating film 17 is formed thickly. More specifically, the device 106 has an advantage that a weak portion in the insulating film 17 can be reinforced. Differently from the device 103, the connecting portion LE is covered with a gate wiring 42 in the device 106. Therefore, it is possible to obtain a much greater advantage by reinforcing the connecting portion LE with the n-type semiconductor layer 45.

In the same manner as in the device 103, moreover, the n-type semiconductor layer 45 is also formed without a clearance between adjacent gate trenches 6 to cover the whole region corresponding to a portion provided under a gate wiring 9 in an upper main surface of a semiconductor substrate 90. Therefore, it is possible to obtain an advantage that a deterioration in the insulating film 17 caused by dry etching can be compensated in the region corresponding to the portion directly under the gate wiring 9. As shown in FIG. 61, moreover, the n-type semiconductor layer 45 is formed like a band in a direction of an array of the gate trenches 6. Consequently, alignment of a mask pattern can easily be performed in a manufacturing process.

In order to manufacture the device 106, it is preferable that arsenic should be selectively implanted to form the n-type semiconductor layer 45 instead of forming the n-type semiconductor layer 5 at the steps of FIGS. 13 to 15 in the method for manufacturing the device 101. For this purpose, it is desirable that patterning of a resist layer 35 should be executed to have an opening in portions corresponding to an n-type semiconductor layer 23 and the n-type semiconductor layer 45. Furthermore, it is preferable that the steps of FIGS. 49 to 56 according to the fifth embodiment should be executed after the steps of FIGS. 8 to 24 are completed.

<7. Seventh Embodiment>

Figure 64:
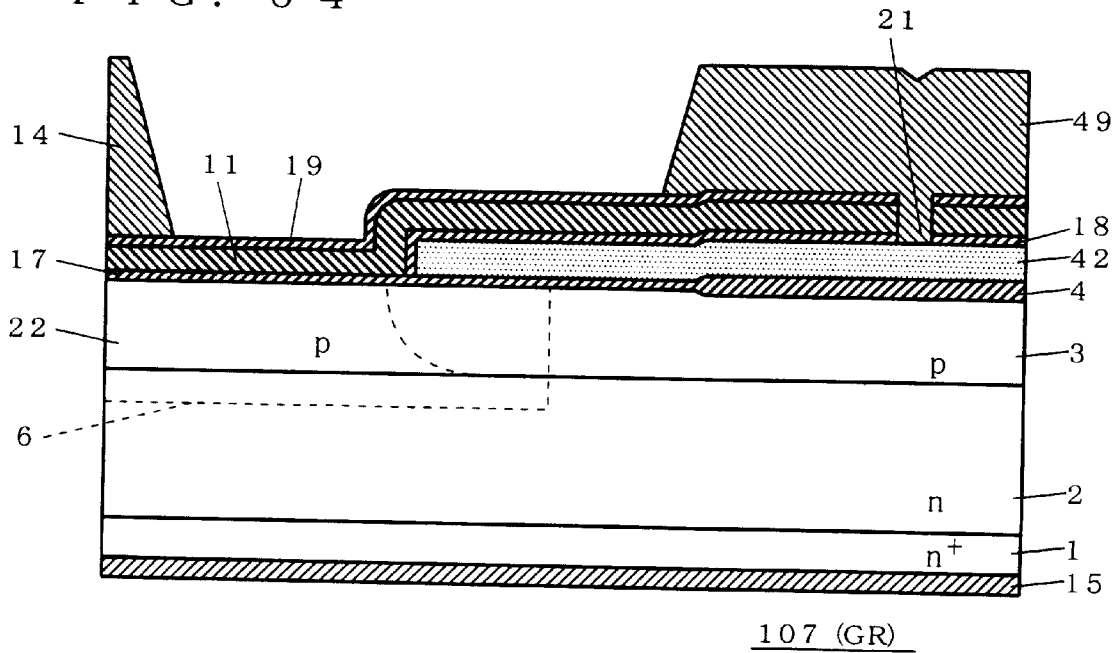
FIG. 64 is a sectional front view showing a device according to a seventh embodiment.

FIG. 64 is a sectional view showing a gate wiring region GR of a device 107 according to a seventh embodiment, which is taken along a cutting line B—B (FIG. 2). The device 107 is characteristically different from the device 105 according to the fifth embodiment in that the p well layer 3 is formed to have the same depth as a depth of a p type semiconductor layer 22 in the same manner as in the device 104 according to the fourth embodiment. For this reason, a lower end BE of an edge of a gate trench 6 along its longitudinal direction is not covered with the p well layer 3 but is directly surrounded by an n-type epitaxial layer 2.

Also in the device 107, the same advantages as in the device 104 can be obtained. More specifically, if an impurity concentration in the p well layer 3 is set equal to that of the p-type semiconductor layer 22, the p well 3 and an n-type semiconductor layer 23 can be formed at the same time. Thus, it is possible to obtain an advantage that a manufacturing process can be simplified.

In order to manufacture the device 107, it is preferable that the step of FIG. 9 in the method for manufacturing the device 101 should be omitted and the p-type semiconductor layer 22 should be enlarged up to a region of the p well layer 3 at the steps of FIGS. 10 and 11. For this purpose, it is desirable that the resist layer 33 in FIG. 10 should be selectively opened in regions corresponding to both the p-type semiconductor layer 22 and the p well layer 3. Moreover, it is preferable that the steps of FIGS. 49 to 56 according to the fifth embodiment should be executed after the steps of FIGS. 8 to 24 are completed.

<8. Eighth Embodiment>

Figure 65:
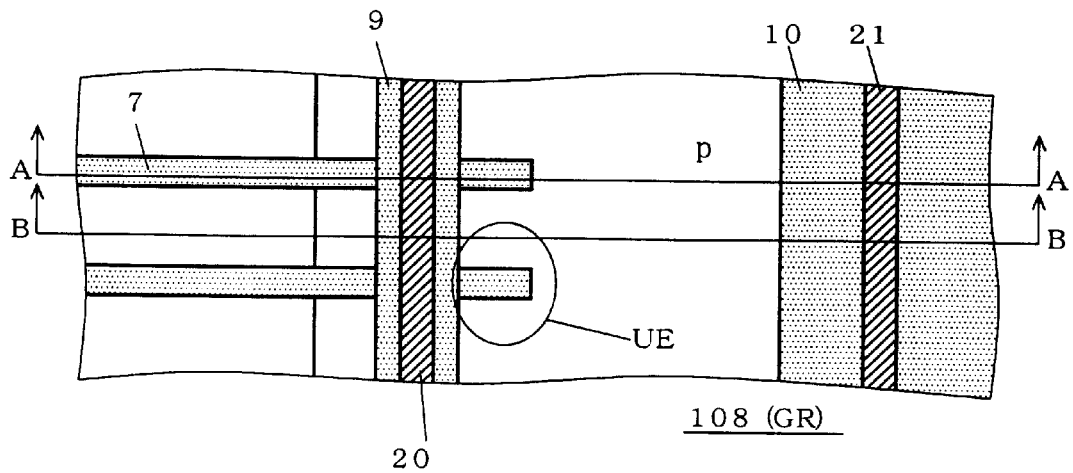
FIG. 65 is a plan view showing a device according to an eighth embodiment.
Figure 66:
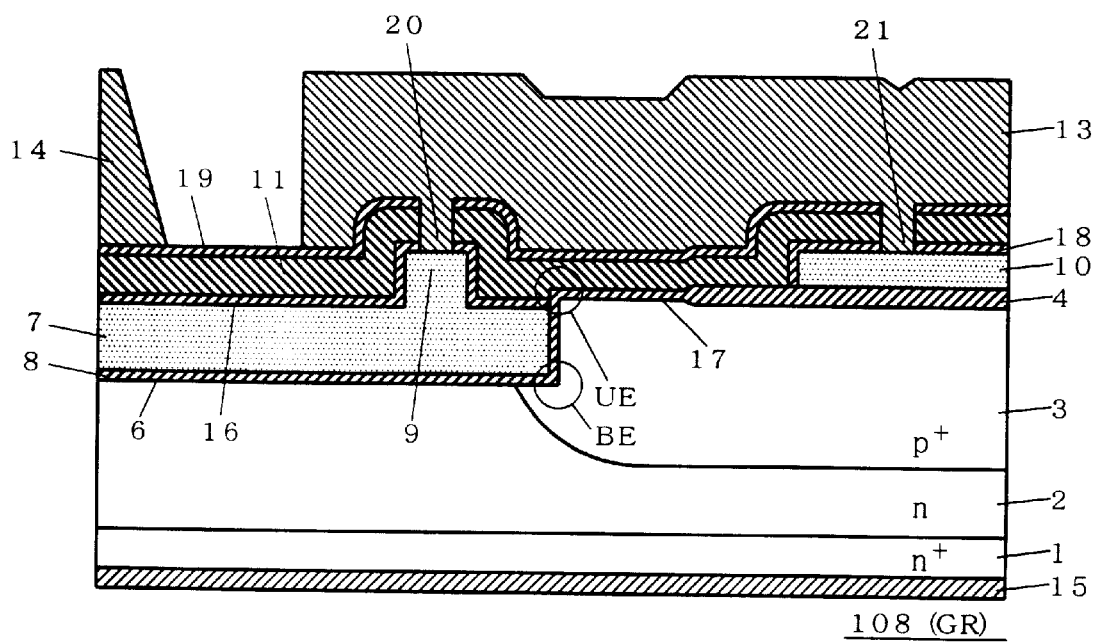
FIG. 66 is a sectional front view showing the device according to the eighth embodiment.

FIG. 65 is a plan view showing a gate wiring region GR of a device 108 according to an eighth embodiment. Moreover, FIG. 66 is a sectional view taken along a cutting line A—A in FIG. 65. The device 108 is characteristically different from the device 101 according to the first embodiment in that an n-type semiconductor layer 5 is not formed. Since the n-type semiconductor layer 5 is not formed, it is impossible to obtain an advantage that a gate insulating film 8 and an insulating film 17 are formed thickly in an upper end UE of a gate trench 6. However, a gate wiring is provided to keep away from the upper end UE in the same manner as in the device 101. Therefore, it is possible to properly obtain an effect that a concentration of an electric field generated in the gate insulating film 8 and the insulating film 17 at the upper end UE by the application of a gate voltage can be relieved or eliminated.

In order to manufacture the device 108, it is preferable that arsenic should be selectively implanted such that only an n-type semiconductor layer 23 is formed and the n-type semiconductor layer 5 is not formed at the steps of FIGS. 13 to 15 in the method for manufacturing the device 101. For this purpose, it is desirable that patterning of a resist layer 35 should be executed to have an opening in only a portion corresponding to the n-type semiconductor layer 23.

Figure 67:
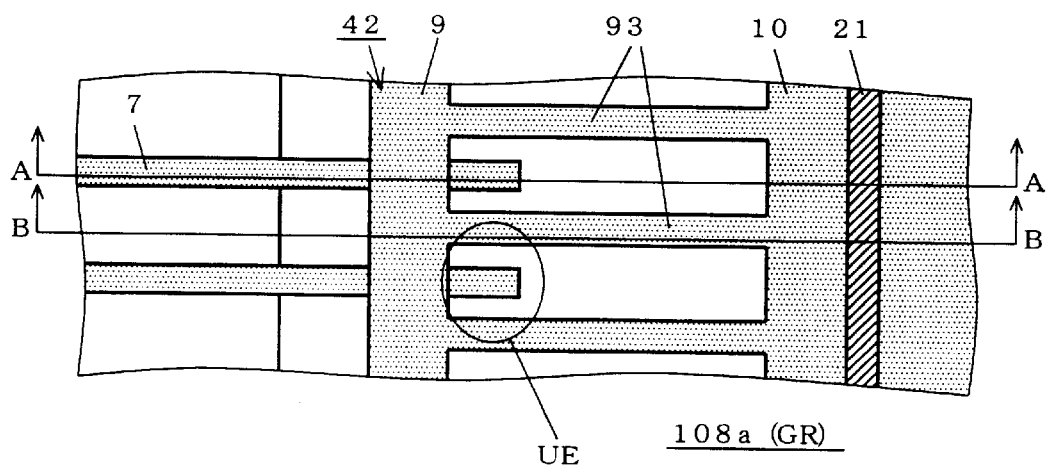
FIG. 67 is a plan view showing another example of the device according to the eighth embodiment.
Figure 68:
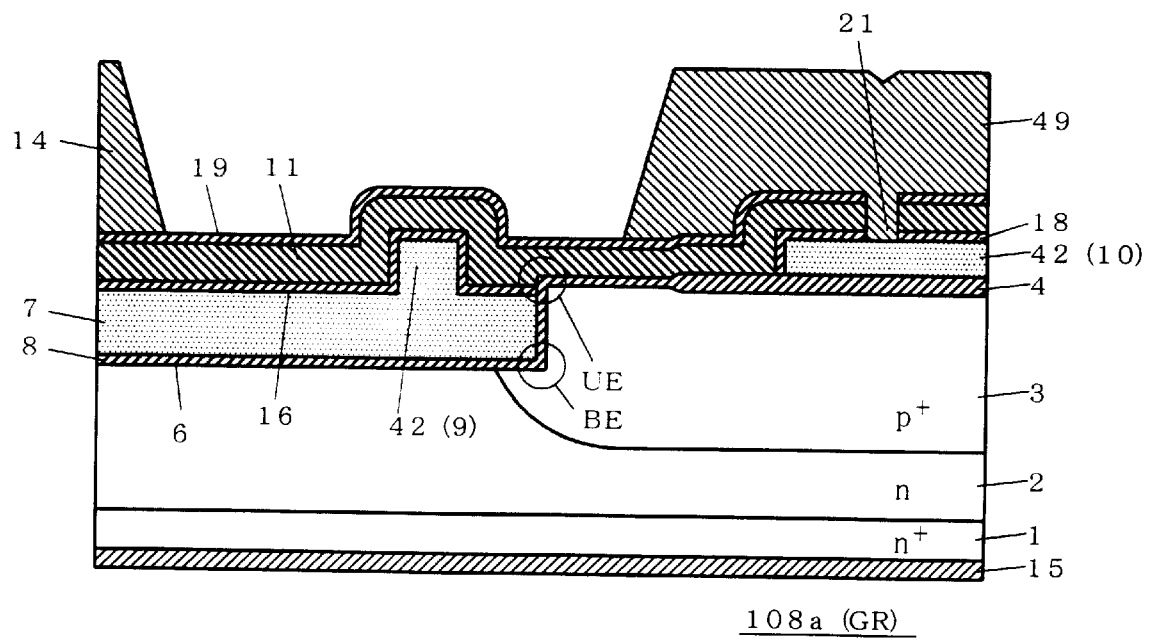
FIG. 68 is a sectional front view showing yet another example of the device according to the eighth embodiment.
Figure 69:
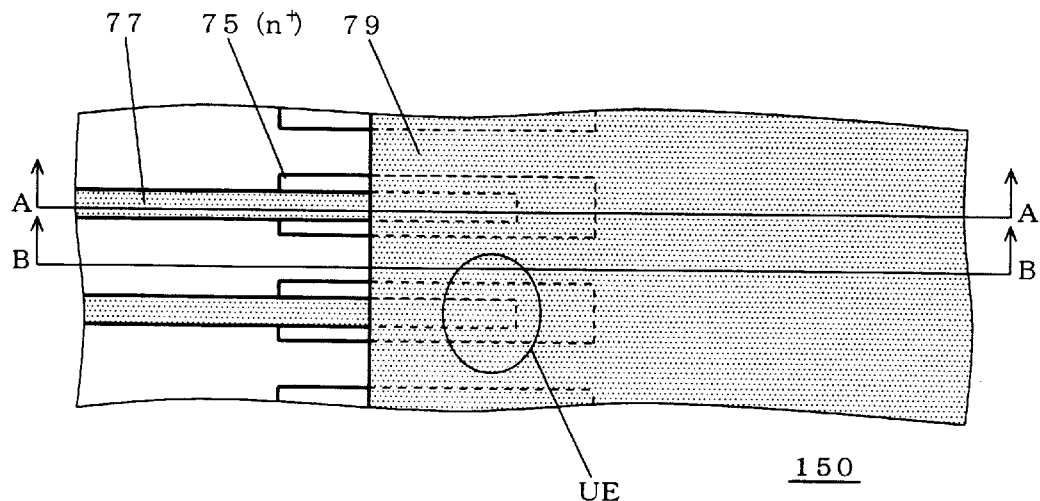
FIG. 69 is a plan view showing a device according to the prior art.
Figure 70:
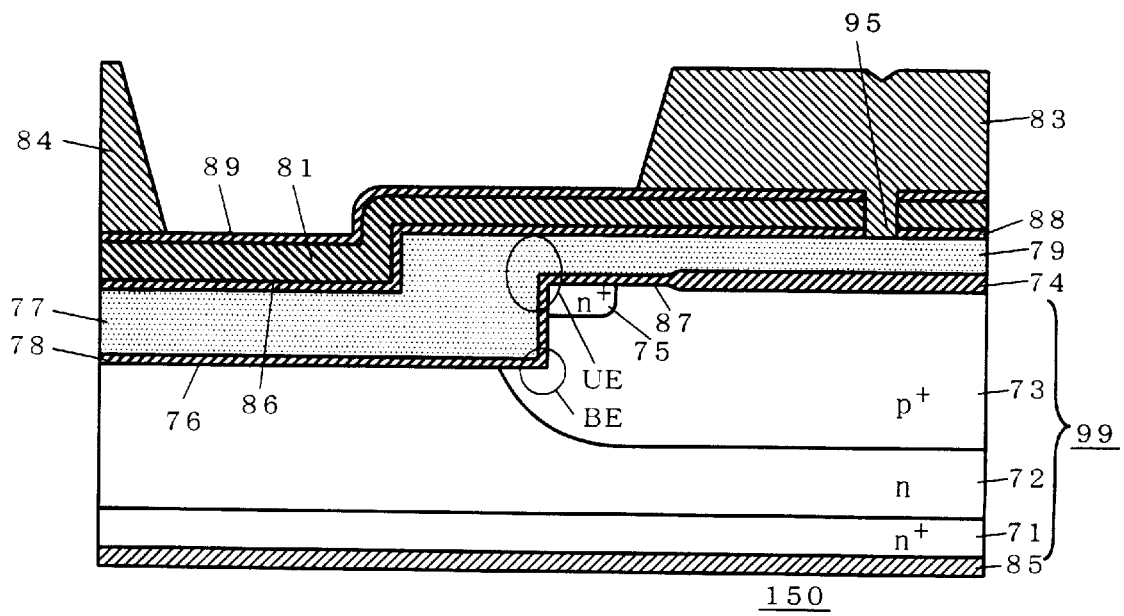
FIGS. 70 and 71 are sectional front views showing the device according to the prior art.
Figure 71:
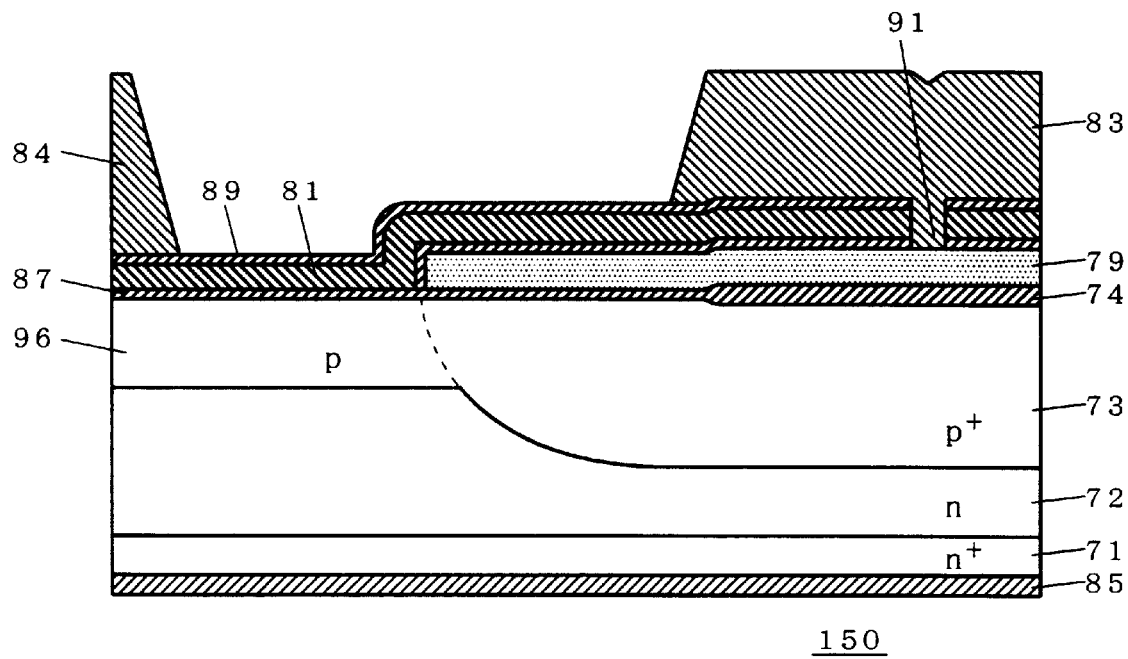
Figure 72:
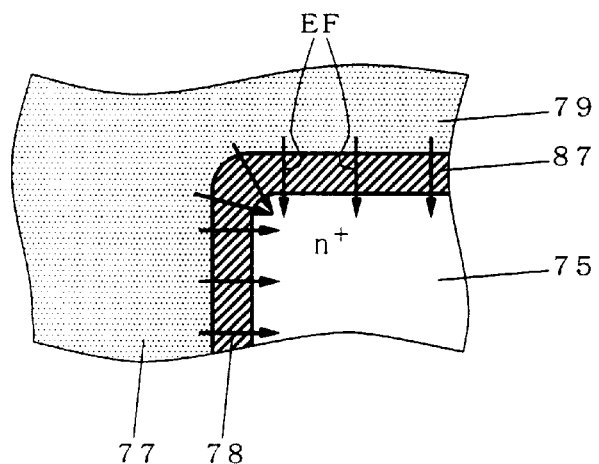
FIG. 72 is an enlarged sectional front view showing the device according to the prior art.

FIG. 67 is a plan view showing a gate wiring region GR of another device 108a according to the eighth embodiment. Moreover, FIG. 68 is a sectional view taken along a cutting line A—A in FIG. 67. The device 108a is characteristically different from the device 105 according to the fifth embodiment in that an n-type semiconductor layer 5 is not formed. Also in the device 108a, a gate wiring is provided to keep away from an upper end UE. Therefore, it is possible to properly obtain an effect that a concentration of an electric field generated in a gate insulating film 8 and an insulating film 17 at the upper end UE by the application of a gate voltage can be relieved or eliminated.

In order to manufacture the device 108a, it is preferable that arsenic should be selectively implanted such that only an n-type semiconductor layer 23 is formed and the n-type semiconductor layer 5 is not formed at the steps of FIGS. 13 to 15 in the method for manufacturing the device 101. For this purpose, it is desirable that patterning of a resist layer 35 should be executed to have an opening in only a portion corresponding to the n-type semiconductor layer 23. Furthermore, it is preferable that the steps of FIGS. 49 to 56 according to the fifth embodiment should be executed after the steps of FIGS. 8 to 24 are completed.

<9. Variant>

(1) While an n channel type MOSFET has been taken as an example in each of the above-mentioned embodiments, the present invention can similarly be practiced and can produce the same effects for a p channel type MOSFET.

(2) Although a so-called U-MOSFET having a U-shaped cross section (a section taken along the cutting line C—C in FIG. 2) of the gate trench 6 has been illustrated in each of the above-mentioned embodiments, the present invention can similarly be practiced for a so-called V-MOSFET having a V-shaped section.

(3) While the example in which the p well layer 3 is provided has been described in each of the above-mentioned embodiments, the present invention can be carried out for a device having no p well layer 3 with a deterioration in a breakdown voltage. Also in the device having such a structure, as long as the gate wiring is provided to keep away from the upper end UE, it is possible to properly obtain an effect that the concentration of the electric field generated in the gate insulating film 8 and the insulating film 17 at the upper end UE by the application of a gate voltage can be relieved or eliminated.

(4) Although the insulating film 4 which is thicker than the insulating film 17 has been formed between the p well layer 3 and the gate wiring 10 in each of the above-mentioned embodiments, the present invention can also be carried out for a device having such a structure that an insulation of the p well layer 3 and the gate wiring 10 is kept by the insulating film 17 without the formation of the insulating film 4. Also in the device having such a structure, as long as the gate wiring is provided to keep away from the upper end UE, it is possible to properly obtain an effect that the concentration of the electric field generated in the gate insulating film 8 and the insulating film 17 at the upper end UE by the application of the gate voltage can be relieved or eliminated.

(5) While the example in which the source electrode 14 and the drain electrode 15 are provided on the two main surfaces of the semiconductor substrate 90 has been described in each of the above-mentioned embodiments, the present invention can also be practiced for a device in which both the source electrode 14 and the drain electrode 15 are connected to a main surface on the side where the gate trench 6 is opened.

(6) Although the MOSFET has been taken as an example in each of the above-mentioned embodiments, the present invention can similarly be practiced for insulated gate semiconductor devices such as an IGBT and the like other than the MOSFET. For example, if the n-type substrate layer 1 is replaced with a p-type substrate layer, the IGBT can be implemented. More specifically, the present invention can be practiced for a general insulated gate semiconductor device in which a gate electrode opposed to a channel region with an insulating film interposed therebetween is buried in a trench.

(7) While the example in which a plurality of gate trenches 6 are arranged in a string has been described in each of the above-mentioned embodiments, the present invention can also be practiced for a device having a single gate trench 6.

While the present invention has been described in detail, the above-mentioned description is illustrative in all aspects and the present invention is not restricted thereto. It is understood that numerous variants which are not illustrated can be supposed without departing from the scope of the invention.

What is claimed is:

1. An insulated gate semiconductor device comprising:

a semiconductor substrate (90) defining an upper main surface and a lower main surface;

said semiconductor substrate including:

a first semiconductor layer (2) of a first conductivity type which is exposed to said upper main surface;

a second semiconductor layer (22) of a second conductivity type which is selectively formed in a portion of said upper main surface in said first semiconductor layer; and a third semiconductor layer (23) of said first conductivity type which is selectively formed in a portion of said upper main surface in said second semiconductor layer and has a higher impurity concentration than an impurity concentration in said first semiconductor layer, wherein said semiconductor substrate is provided with a trench (6) opened on said upper main surface and reaching said first semiconductor layer through said third and second semiconductor layers, said device further comprising:

an insulating film (8, 17, 4) covering an internal wall of said trench and said upper main surface;

a gate electrode (7) buried in said trench through said insulating film;

a first gate wiring (9) which is selectively provided both on said gate electrode apart from an edge of said trench along its longitudinal direction and on said insulating film covering said upper main surface, is made of the same material as a material of said gate electrode and is continuously provided integrally with said gate electrode;

a second gate wiring (10) which is provided over said upper main surface through said insulating film opposite to said first gate wiring apart from said edge of said trench and is made of the same material as said material of said gate electrode;

a third gate wiring (13, 93) for electrically connecting said first gate wiring and said second gate wiring; and a pair of main electrodes (14, 15) which are electrically connected to a surface of said semiconductor substrate, respectively, wherein said third gate wiring is provided apart from said edge of said trench, one of said pair of main electrodes (14) is electrically connected to said second and third semiconductor layers on said upper main surface, and an upper surface of said gate electrode is positioned on the same plane with said upper main surface or therebelow in a portion which is in contact with said edge of said trench.

2. The insulated gate semiconductor device according to claim 1, further comprising an insulating layer (11, 18, 19) covering said first and second gate wirings and having a first opening (20, 40, 41) and a second opening (21) selectively formed on said first and second gate wirings, respectively, wherein said third gate wiring includes a connecting wiring (13) formed on said insulating layer and electrically connecting said first gate wiring and said second gate wiring through said first and second openings.

3. The insulated gate semiconductor device according to claim 2, wherein said trench is divided into a plurality of unit trenches (6) arranged in parallel with each other, and said first gate wiring is provided like a band to intersect said unit trenches.

4. The insulated gate semiconductor device according to claim 3, wherein said first opening (20) is formed like a band in a longitudinal direction of said first gate wiring.

5. The insulated gate semiconductor device according to claim 3, wherein said first opening (40) is dispersively formed to keep away from portions above said unit trenches.

6. The insulated gate semiconductor device according to claim 3, wherein said first opening (41) is dispersively formed by selecting portions above said unit trenches.

7. The insulated gate semiconductor device according to claim 1, wherein said third gate wiring includes a connecting wiring (93) which is provided over said upper main surface through said insulating film, is made of the same material as materials of said first and second gate wirings, and is continuously provided integrally with said first and second gate wirings.

8. The insulated gate semiconductor device according to claim 7, further comprising an insulating layer (11, 18, 19) covering said first and second gate wirings and having a first opening (20, 40, 41) and a second opening (21) selectively formed on said first and second gate wirings, respectively, wherein said third gate wiring further includes another connecting wiring (13) formed on said insulating layer and electrically connecting said first gate wiring and said second gate wiring through said first and second openings.

9. The insulated gate semiconductor device according to claim 7, wherein said trench is divided into a plurality of unit trenches (6) arranged in parallel with each other, said first gate wiring is provided like a band to intersect said unit trenches, and said connecting wiring is provided along a region interposed between said unit trenches in said upper main surface.

10. The insulated gate semiconductor device according to claim 1, wherein said insulating film covering said upper main surface of said semiconductor substrate is formed as a thick insulating film (4) more thickly in a region directly under said second gate wiring than in other regions.

11. The insulated gate semiconductor device according to claim 10, wherein said semiconductor substrate further includes a high concentration semiconductor layer (45, 46) of a first conductivity type which is selectively formed in said upper main surface to surround an upper end (UE) of said edge of said trench and has a higher impurity concentration than an impurity concentration in said first semiconductor layer, said high concentration semiconductor layer being also formed to cover a portion directly under an edge (LE) of said thick insulating film.

12. The insulated gate semiconductor device according to claim 1, wherein said semiconductor substrate further includes a fourth semiconductor layer of said second conductivity type which is selectively formed in a portion of said upper main surface including a region directly under said second gate wiring so as to be coupled to said second semiconductor layer and to surround a periphery thereof, said fourth semiconductor layer being deeper than said second semiconductor layer and surrounding a lower end (BE) of said edge of said trench.

13. The insulated gate semiconductor device according to claim 1, wherein said second semiconductor layer is extended to a region directly under said second gate wiring in said upper main surface.

14. The insulated gate semiconductor device according to claim 1, wherein said semiconductor substrate further includes a high concentration semiconductor layer (5, 45, 46) of a first conductivity type which is selectively formed in said upper main surface to surround an upper end (UE) of said edge of said trench and has a higher impurity concentration than an impurity concentration in said first semiconductor layer.

15. The insulated gate semiconductor device according to claim 14, wherein said high concentration semiconductor layer (5, 45) is also formed to cover a region directly under said first gate wiring.

16. A method of manufacturing an insulated gate semiconductor device comprising:

a step of preparing a semiconductor substrate (90) defining an upper main surface and a lower main surface and including a first semiconductor layer (2) of a first conductivity type which is exposed to said upper main surface;

a step of selectively forming a second semiconductor layer (22) of a second conductivity type in a portion of said upper main surface in said first semiconductor layer by selectively introducing an impurity of said second conductivity type into said upper main surface;

a third semiconductor layer forming step of selectively forming a third semiconductor layer (23) of said first conductivity type having a higher impurity concentration than an impurity concentration in said first semiconductor layer in a portion of said upper main surface in said second semiconductor layer by selectively introducing an impurity of said first conductivity type into said upper main surface;

a trench forming step of selectively forming, in said semiconductor substrate, a trench (6) reaching said first semiconductor layer through said third and second semiconductor layers by selectively performing etching on said upper main surface;

a step of forming an insulating film (8, 17, 4) covering an internal wall of said trench and said upper main surface;

a step of depositing a conductive layer (38) to cover said insulating film;

a gate forming step of, by selectively removing said conductive layer, forming a gate electrode (7) buried in said trench through said insulating film, a first gate wiring (9) which is selectively provided both on said gate electrode apart from an edge of said trench along its longitudinal direction and on said insulating film covering said upper main surface and is continuously provided integrally with said gate electrode, and a second gate wiring (10) provided over said upper main surface through said insulating film opposite to said first gate wiring apart from said edge of said trench;

a step of depositing an insulating layer (11, 18, 19) to cover said first and second gate wirings;

a step of selectively forming a first opening (20, 40, 41) and a second opening (21) over said first and second gate wirings in said insulating layer, respectively;

a step of forming a connecting wiring (13) which electrically connects said first gate wiring and said second gate wiring by covering said insulating layer and filling in said first and second openings; and a main electrode forming step of forming a pair of main electrodes (14, 15) to be electrically connected to a surface of said semiconductor substrate, respectively, wherein one of said pair of main electrodes (14) is formed to be electrically connected to said second and third semiconductor layers on said upper main surface at said main electrode forming step, and said gate electrode is formed such that an upper surface of said gate electrode is positioned on the same plane with said upper main surface or therebelow in a portion which is in contact with said edge of said trench at said gate forming step.

17. The method of manufacturing an insulated gate semiconductor device according to claim 16, further comprising:

a step of forming, on said upper main surface, a shielding film (34) selectively opened prior to said trench forming step; and a step of selectively forming a thick insulating film which is thicker than said insulating film in a region where said shielding film is opened by performing a thermal oxidation treatment on said upper main surface, wherein said trench is formed to keep away from said thick insulating film at said trench forming step, and said second gate wiring is formed on said thick insulating film at said gate forming step.

18. The method of manufacturing an insulated gate semiconductor device according to claim 16, further comprising:

a step of selectively forming, in a portion of said upper main surface of said semiconductor substrate, a high concentration semiconductor layer (5, 45, 46) of a first conductivity type which has a higher impurity concentration than an impurity concentration in said first semiconductor layer by selectively introducing an impurity of said first conductivity type into said upper main surface simultaneously with said third semiconductor forming step, wherein an upper end of said edge of said trench is formed to be surrounded by said high concentration semiconductor layer at said trench forming step.

19. A method of manufacturing an insulated gate semiconductor device comprising:

a step of preparing a semiconductor substrate (90) defining an upper main surface and a lower main surface and including a first semiconductor layer (2) of a first conductivity type which is exposed to said upper main surface;

a step of selectively forming a second semiconductor layer (22) of a second conductivity type in a portion of said upper main surface in said first semiconductor layer by selectively introducing an impurity of said second conductivity type into said upper main surface;

a third semiconductor layer forming step of selectively forming a third semiconductor layer (23) of said first conductivity type having a higher impurity concentration than an impurity concentration in said first semiconductor layer in a portion of said upper main surface in said second semiconductor layer by selectively introducing an impurity of said first conductivity type into said upper main surface;

a trench forming step of selectively forming, in said semiconductor substrate, a trench (6) reaching said first semiconductor layer through said third and second semiconductor layers by selectively performing etching on said upper main surface;

a step of forming an insulating film (8, 17, 4) covering an internal wall of said trench and said upper main surface;

a step of depositing a conductive layer (38) to cover said insulating film;

a gate forming step of, by selectively removing said conductive layer, forming a gate electrode (7) buried in said trench through said insulating film, a first gate wiring (9) which is selectively provided both on said gate electrode apart from an edge of said trench along its longitudinal direction and on said insulating film covering said upper main surface and is continuously provided integrally with said gate electrode, a second gate wiring (10) provided over said upper main surface through said insulating film opposite to said first gate wiring apart from said edge of said trench, and a connecting wiring (93) provided over said upper main surface through said insulating film apart from said edge of said trench and continuously provided integrally with said first and second gate wirings; and a main electrode forming step of forming a pair of main electrodes (14, 15) to be electrically connected to a surface of said semiconductor substrate, respectively, wherein one of said pair of main electrodes (14) is formed to be electrically connected to said second and third semiconductor layers on said upper main surface at said main electrode forming step, and said gate electrode is formed such that an upper surface of said gate electrode is positioned on the same plane with said upper main surface or therebelow in a portion which is in contact with said edge of said trench at said gate forming step.

20. The method of manufacturing an insulated gate semiconductor device according to claim 19, further comprising:

a step of depositing an insulating layer (11, 18, 19) to cover said first and second gate wirings;

a step of selectively forming a first opening (20, 40, 41) and a second opening (21) over said first and second gate wirings in said insulating layer, respectively; and a step of forming another connecting wiring (13) which electrically connects said first gate wiring and said second gate wiring by covering said insulating layer and filling in said first and second openings.

* * * * *